(12) United States Patent
Kawakita et al.

(10) Patent No.: US 8,300,671 B2
(45) Date of Patent: Oct. 30, 2012

(54) SURFACE EMITTING LASER

(75) Inventors: Yasumasa Kawakita, Tokyo (JP);
Hitoshi Shimizu, Tokyo (JP); Takeo Kageyama, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/176,921

(22) Filed: Jul. 6, 2011

(65) Prior Publication Data

US 2012/0008659 A1     Jan. 12, 2012

(30) Foreign Application Priority Data

Jul. 7, 2010   (JP) ................. 2010-155039

(51) Int. Cl.
*H01S 5/00* (2006.01)
(52) U.S. Cl. .................................................. 372/45.01
(58) Field of Classification Search .............. 372/45.01
See application file for complete search history.

(56) References Cited

U.S. PATENT DOCUMENTS

| 2001/0021567 | A1* | 9/2001 | Takahashi | 438/424 |
| 2005/0271107 | A1* | 12/2005 | Murakami et al. | 372/50.1 |
| 2006/0245998 | A1* | 11/2006 | Kahn et al. | 423/592.1 |

FOREIGN PATENT DOCUMENTS

JP    2002-359434 A    12/2002

* cited by examiner

*Primary Examiner* — Patrick Stafford
(74) *Attorney, Agent, or Firm* — Lowe, Hauptman, Ham & Berner, LLP

(57) ABSTRACT

A surface emitting laser includes a cavity region formed on a group-III-V compound substrate, which includes an active layer and a current confinement layer that has an aluminum oxide compound and confines a current path through which a current is injected into the active layer, an upper DBR mirror and a lower DBR mirror formed on the substrate, sandwiching the cavity region, and a graded-composition layer disposed to contact the current confinement layer, which has an aluminum composition ratio decreasing monotonically as a distance from the current confinement layer increases. The graded-composition layer includes a first region that contacts the current confinement layer and an oxidation stop layer that contacts the first region and that has a change rate of the aluminum composition ratio larger than that of the first region. The graded-composition layer is oxidized from an interface with the current confinement layer to at least a portion of the oxidation stop layer.

19 Claims, 22 Drawing Sheets

SURFACE EMITTING LASER

The contents of the following Japanese patent application are incorporated herein by reference: No. 2010-155039 filed on Jul. 7, 2010.

BACKGROUND

1. Technical Field

The present invention relates to a surface emitting laser, and more particularly, to a surface emitting laser including a current confinement layer that confines a current path through which current flows between electrodes.

2. Related Art

The current confinement layer includes an oxidized insulating layer obtained by selectively oxidizing compound semiconductor including aluminum, such as AlAs, and an opening portion made of the compound semiconductor including aluminum in which a high current (carrier) density is obtained by the oxidized insulating layer.

To increase current input efficiency in such a semiconductor laser device, one idea is to provide, on both sides of the current confinement layer, graded-composition layers of AlGaAs in which the aluminum composition ratio gradually decreases as a distance from the surface of the current confinement layer increases.

Japanese Patent Application Laid-open No. 2002-359434, for example, describes a surface emitting laser device in which AlGaAs graded-composition layers are disposed on both sides of an AlAs layer. In each AlGaAs graded-composition layer, the aluminum composition ratio decreases continuously until reaching $Al_{0.15}Ga_{0.85}As$, which is the material of the AlAs cavity spacer layer.

The inventors of the present invention used such techniques to manufacture a semiconductor laser device that includes AlGaAs graded-composition layers on both sides of a current confinement layer. However, when manufacturing the device, because it was difficult to control the oxidation of regions near the interfaces between oxidized regions of the current confinement layer and the AlGaAs graded-composition layers, peeling of the layers occurred near the oxidized regions, resulting in poor yield. When the current confinement layer was near the active layer, the unevenness of the oxidation penetration at the interfaces between the oxidized regions and the non-oxidized regions made it impossible to obtain an active layer with uniform characteristics. In addition, dislocations caused by strain occurred in the active layers, further decreasing the yield. Even if there were no problems during manufacturing, the resulting devices had poor long-time reliability.

The present invention has been achieved in view of the above aspects, and it is an object of the present invention to improve yield when manufacturing surface emitting laser devices and to provide a surface emitting laser device that has excellent long-time reliability.

SUMMARY

According to one aspect of the present invention, there is provided a surface emitting laser including a cavity region formed on a group-III-V compound substrate, which includes an active layer and a current confinement layer that has an aluminum oxide compound and confines a current path through which a current is injected into the active layer, an upper DBR mirror and a lower DBR mirror formed on the substrate, sandwiching the cavity region, and a graded-composition layer disposed to contact the current confinement layer, which has an aluminum composition ratio decreasing monotonically as a distance from the current confinement layer increases. The graded-composition layer includes a first region that contacts the current confinement layer and an oxidation stop layer that contacts the first region and that has a change rate of the aluminum composition ratio larger than that of the first region. The graded-composition layer is oxidized from an interface with the current confinement layer to at least a portion of the oxidation stop layer.

According to another aspect of the present invention, there is provided a surface emitting laser including a cavity region formed on a group-III-V compound substrate, which includes an active layer, and an upper DBR mirror and a lower DBR mirror formed on the group-III-V compound substrate, sandwiching the cavity region. At least a portion of either one of the upper DBR mirror and the lower DBR mirror includes a current confinement layer that has an aluminum oxide compound and confines a current path through which a current is injected into the active layer. The surface emitting laser further includes a graded-composition layer disposed to contact the current confinement layer, which has an aluminum composition ratio decreasing monotonically as a distance from the current confinement layer increases. The graded-composition layer includes a first region that contacts the current confinement layer and an oxidation stop layer that contacts the first region and that has a change rate of the aluminum composition ratio larger than that of the first region. The graded-composition layer is oxidized from an interface with the current confinement layer to at least a portion of the oxidation stop layer.

The present invention can provide a surface emitting laser device that has excellent reliability and that includes a current confinement layer formed of a compound including Al and an oxidized insulating substance, as well as a method for manufacturing the surface emitting laser device.

DESCRIPTION OF EXEMPLARY EMBODIMENTS

Exemplary embodiments of the present invention will be described in detail below with reference to accompanying drawings. However, the embodiments should not be construed to limit the invention. All the combinations of the features described in the embodiments are not necessarily essential to means provided by aspects of the invention.

Figure 1:
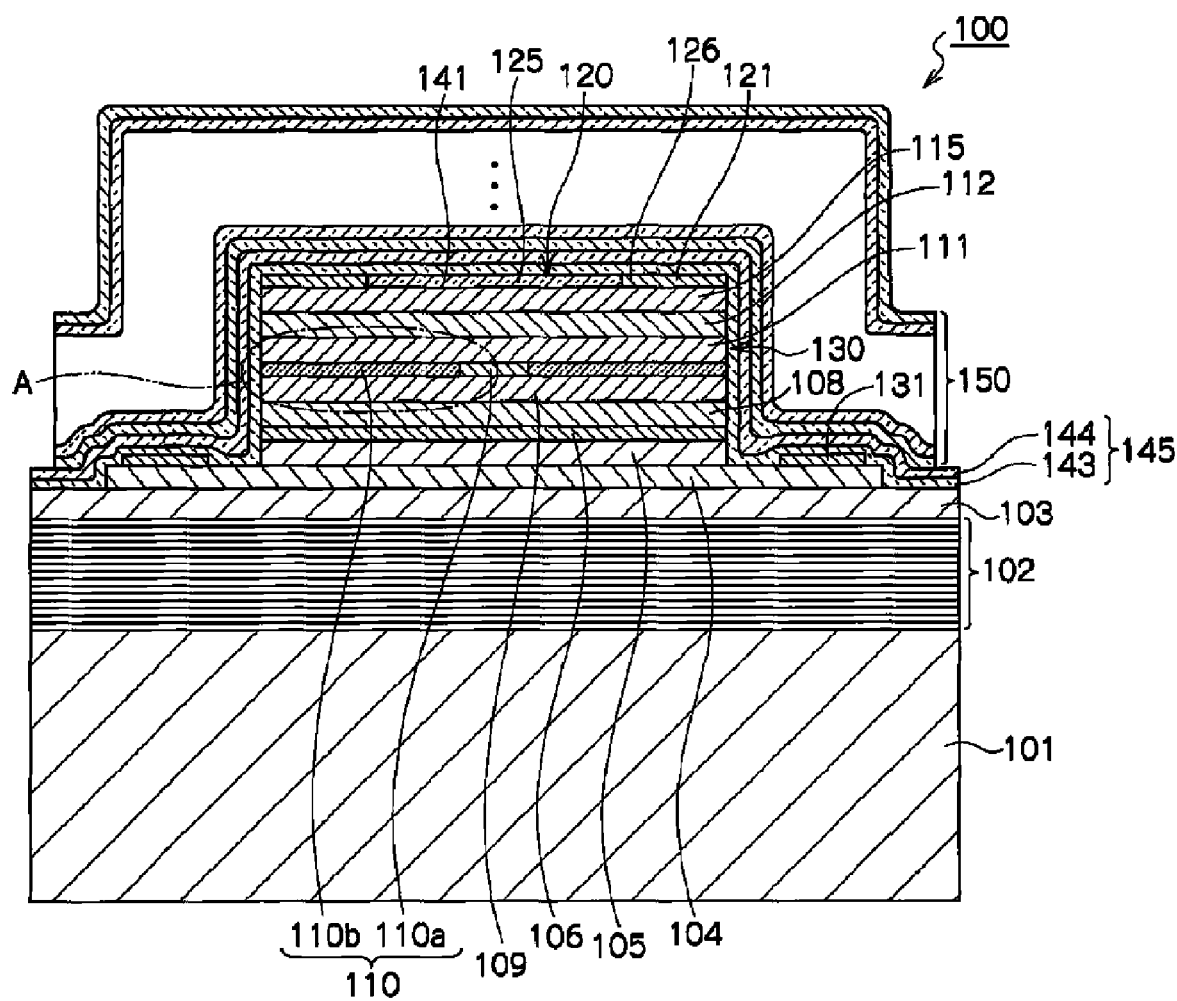
FIG. 1 is a schematic vertical cross-sectional view of a surface emitting laser device according to an embodiment of the present invention.

FIG. 1 is a schematic vertical cross-sectional view of a surface emitting laser device 100 according to an embodiment of the present invention. As shown in FIG. 1, the surface emitting laser device 100 includes a layered structure in which a lower DBR mirror 102, a buffer layer 103, an $n^+$-type contact layer 104, an n-type spacer layer 105, an active layer 106, a first p-type spacer layer 107, a lower graded-composition layer 109, a current confinement layer 110, an upper graded-composition layer 111, a second p-type spacer layer 112, and a $p^+$-type contact layer 115 are sequentially formed in the stated order on a substrate 101.

Among these layers, at least the layers from the n-type spacer layer 105 to the $p^+$-type contact layer 115 form a cylindrical mesa post 130. The current confinement layer 110 includes a current confinement portion 110b positioned in the periphery of the mesa post 130 and a circular current injection portion 110a surrounded by the current confinement portion 110b. The diameter of the current injection portion 110a is preferably no less than 4 μm and no larger than 10 μm, and may be 6 μm, for example. The current confinement portion 110b limits the current path between a p-side annular electrode 121 and a semi-annular n-side electrode 131, and concentrates the current in the current injection portion 110a.

The substrate 101 is an undoped GaAs substrate, for example. The lower DBR mirror 102 includes 34 pairs of GaAs/Al$_{0.9}$Ga$_{0.1}$As. The buffer layer 103 is made of n-type GaAs. The $n^+$-type contact layer 104 is made of $n^+$-type GaAs doped with an n-type dopant such as selenium (Se) or silicon (Si). The n-type spacer layer 105 is made of n-type GaAs doped with the n-type dopant. The active layer 106 has a multiple quantum well (MQW) structure including three layers of GaInNAs wells and four layers of GaAs barrier layers in an alternating manner. The topmost and bottommost layers are the GaAs barrier layers. The bottommost GaAs barrier layer also functions as an n-type cladding layer.

The first p-type spacer layer 108, the second p-type spacer layer 112, and the $p^+$-type contact layer 115 are each made of p-type or $p^+$-type GaAs doped with a p-type dopant such as carbon (C), zinc (Zn), or beryllium (Be). The acceptor or donor concentration in each p-type or n-type layer is, for example, approximately $1 \times 10^{18}$ cm$^{-3}$, and the acceptor or donor concentration in each $p^+$-type or $n^+$-type layer is, for example, approximately $3 \times 10^{19}$ cm$^{-3}$ or more.

The p-side annular electrode 121 is formed on the $p^+$-type contact layer 115. The p-side annular electrode 121 is made of Pt/Ti, in which a Ti layer 122 is on the bottom and a Pt layer 123 is on the top. The p-side annular electrode 121 has an opening 125 in the center through which the laser light passes, and has a circumference approximately matching that of the mesa post 130. The outer diameter of the p-side annular electrode 121 is 30 μm, for example.

A disc-shaped dielectric layer 141 of a material having low reactivity to the Pt of the p-side annular electrode 121, for example, silicon nitride (SiN$_x$), is formed in the opening 125 of the p-side annular electrode 121.

In the embodiment of the present invention, the dielectric layer 141 is formed on the $p^+$-type contact layer 115 in the opening 125 of the p-side annular electrode 121. The dielectric layer 141 is formed between the $p^+$-type contact layer 115 and an upper DBR mirror 150. The portion from the top surface of the dielectric layer 141 to the bottom surface of the buffer layer 103 forms a cavity 120.

The p+-type contact layer 115 is designed to be positioned at a node of a standing wave, and therefore the optical thickness of the dielectric layer 141 is adjusted to be approximately λ/4, such that the top surface of the dielectric layer 141 and the bottommost surface of the upper DBR minor 150 are positioned at an anti-node of the standing wave. The optical thickness of a layer is represented as the product of the physical thickness and the refractive index of the layer. Here, λ represents the oscillation wavelength of the laser.

The upper DBR mirror 150 is made of dielectric multilayer film and is formed from above the p-side annular electrode 121 and dielectric layer 141 to the side surfaces of the mesa post 130 and the nearby regions. The upper DBR mirror 150 includes 10 to 12 pairs of $SiN_X/SiO_2$, for example. In order to protect the surface, a passivation layer 145 of $SiN_X$ 144 formed on $SiO_2$ 143 is formed across the entire surface. The $SiN_X$ 144 and $SiO_2$ 143 of the passivation layer 145 also serve as the bottommost $SiN_X$ and $SiO_2$ layers in the upper DBR minor 150. Accordingly, in the upper DBR minor 150 of $SiN_X/SiO_2$, the bottommost layer is the $SiO_2$ of the passivation layer 145 and the $SiN_X$ of the passivation layer 145 is formed thereon, and $SiO_2$ and $SiN_X$ layers are repeatedly formed in an alternating manner until reaching the topmost layer of $SiN_X$.

The n+-type contact layer 104 extends radially outward from the bottom portion of the mesa post 130. The n-side electrode 131 of AuGeNi/Au, for example, in which AuGeNi is on the bottom layer and Au is on the top layer, is formed on the top surface of the region around the base of the mesa post 130. The n-side electrode 131 has an outer diameter of 90 μm and an inner diameter of 50 μm, for example.

An n-side lead electrode (not shown) of Au is formed on the n-side electrode 131 to contact the n-side electrode 131 through an opening (not shown) formed in the passivation layer 145. A p-side lead electrode (not shown) of Au is formed on the p-side annular electrode 121 to contact the p-side annular electrode 121 through an opening (not shown) formed in the passivation layer 145. The n-side lead electrode and the p-side lead electrode respectively connect the n-side electrode 131 and the p-side annular electrode 121 to a current supply circuit (not shown) that is externally provided.

In the surface emitting laser device 100 having the above configuration, voltage is applied between the n-side electrode 131 and the p-side annular electrode 121 from the current supply circuit respectively by the n-side lead electrode and the p-side lead electrode, thereby injecting a drive current. The injected drive current flows mainly through the p+-type contact layer 115 and the p+-type current path layer 113, which have low resistance, and furthermore, the current path is confined in the current injection portion 110a of the current confinement layer 110, so that the drive current is supplied to the active layer 106 with high current density. With this current injection, the active layer 106 emits spontaneous light. A light component of a wavelength λ in the spontaneous light, which is the laser oscillation wavelength, forms a standing wave within the cavity 120 between the lower DBR minor 102 and the upper DBR minor 150, thereby being amplified by the active layer 106. When the injected current exceeds a threshold value, the light forming the standing wave is laser-oscillated, and a laser light of a wavelength in, for example, a 1300-nm band is output upward from the opening 125 of the p-side annular electrode 121.

The following describes a method of manufacturing the surface emitting laser devices 100.

First, molecular beam epitaxy (MBE) or metal organic chemical vapor deposition (MOCVD) is used to sequentially grow the lower DBR minor 102, the buffer layer 103, the n+-type contact layer 104, the n-type spacer layer 105, the active layer 106, the first p-type spacer layer 108, the lower graded-composition layer 109, an $Al_{0.97}Ga_{0.03}As$ layer 110' described further below, the upper graded-composition layer 111, the second p-type spacer layer 112, and the p+-type contact layer 115 on the substrate 101.

CVD and photolithography are used to selectively form the dielectric layer 141 of $SiN_X$ on a portion of the p+-type contact layer 115.

The lift-off technique is used to selectively form the p-side annular electrode 121 on the p+-type contact layer 115.

The p-side annular electrode 121 is used as a metal mask and acid etching, for example, is used to etch the semiconductor layer to a depth reaching the n+-type contact layer 104, thereby forming the mesa post 130. Another mask is then formed, and the n+-type contact layer 104 is etched to a depth reaching the buffer layer 103. As a result, the mesa post 130 shown in FIG. 1 is formed. Since the mesa post 130 is formed in a self-aligning manner with the p-side annular electrode 121, the dimension of the mesa post 130 can be more accurate.

A thermal processing is performed then in a water vapor atmosphere for 1 hour at a temperature of approximately 400° C. As a result, the $Al_{0.97}Ga_{0.03}As$ layer 110' is selectively oxidized from a side surface 132 of the mesa post 130 to be changed into an oxide layer whose primary component is $Al_2O_3$, thereby forming the current confinement portion 110b. The chemical reaction progresses uniformly from the circumference of the $Al_{0.97}Ga_{0.03}As$ layer 110', until only the current injection portion 110a of $Al_{0.97}Ga_{0.03}As$ remains in the center. The processing time for the selective oxidation is changed, for example, to form the current injection portion 110a with a diameter of 6 μm. As a result of this selective oxidation, the center of the mesa post 130, the center of the current injection portion 110a, and the center of the opening 125 of the p-side annular electrode 121 can be matched with a high degree of accuracy.

After this, as shown in FIG. 1, the n-side electrode 131 is formed on the surface of the n+-type contact layer 104 on the periphery of the mesa post 130. The CVD is used to form the passivation layer 145 over the entire surface, and then the openings in the passivation layer 145 are formed above the n-side electrode 131 and the p-side annular electrode 121. The n-side lead electrode and the p-side lead electrode respectively contacting the n-side electrode 131 and the p-side annular electrode 121 via the openings are then formed.

The CVD is then used to form the upper DBR minor 150 of dielectric material, and the bottom surface of the substrate 101 is polished until the substrate 101 reaches a thickness of 150 μm, for example. After this, the surface emitting laser device 100 shown in FIG. 1 is completed by performing device cutting.

A first embodiment of the present invention relates to a surface emitting laser that is suitable for manufacturing by the MBE, and to a manufacturing method thereof.

With the MBE crystal growth, the AlGaAs graded-composition layer whose aluminum composition is continuously changed can be obtained by growing the crystal while gradually changing the temperature of the raw material (cell). However, flux control and reproducibility of the composition profile are still problematic, making it difficult to grow an AlGaAs graded-composition layer in which a continuously-changed aluminum composition. To cope with this problem, a digital alloy technique using a short-period superlattice is utilized. The digital alloy technique is for manufacturing compound semiconductor crystal with pseudo-different compositions by combining two types of thin compound semiconductor crystal, for example. In the first embodiment, AlGaAs and GaAs are combined to create AlGaAs with pseudo-differing compositions. By alternately layering these layers while changing the thickness ratio between the AlGaAs and GaAs layers, AlGaAs is produced with a pseudo-changing Al composition, and by creating a slope in the average Al composition, a pseudo AlGaAs graded-composition layer in which the Al composition pseudo-changes is created. In this way, the lower graded-composition layer 109 is formed by a lower pseudo-graded-composition layer 109' and the upper graded-composition layer 111 is formed by an upper pseudo-graded-composition layer 111'.

The following is a detailed description of the lower pseudo-graded-composition layer 109', the current confinement layer 110, and the upper pseudo-graded-composition layer 111' according to the first embodiment, with reference to FIGS. 2 to 5.

Figure 2:
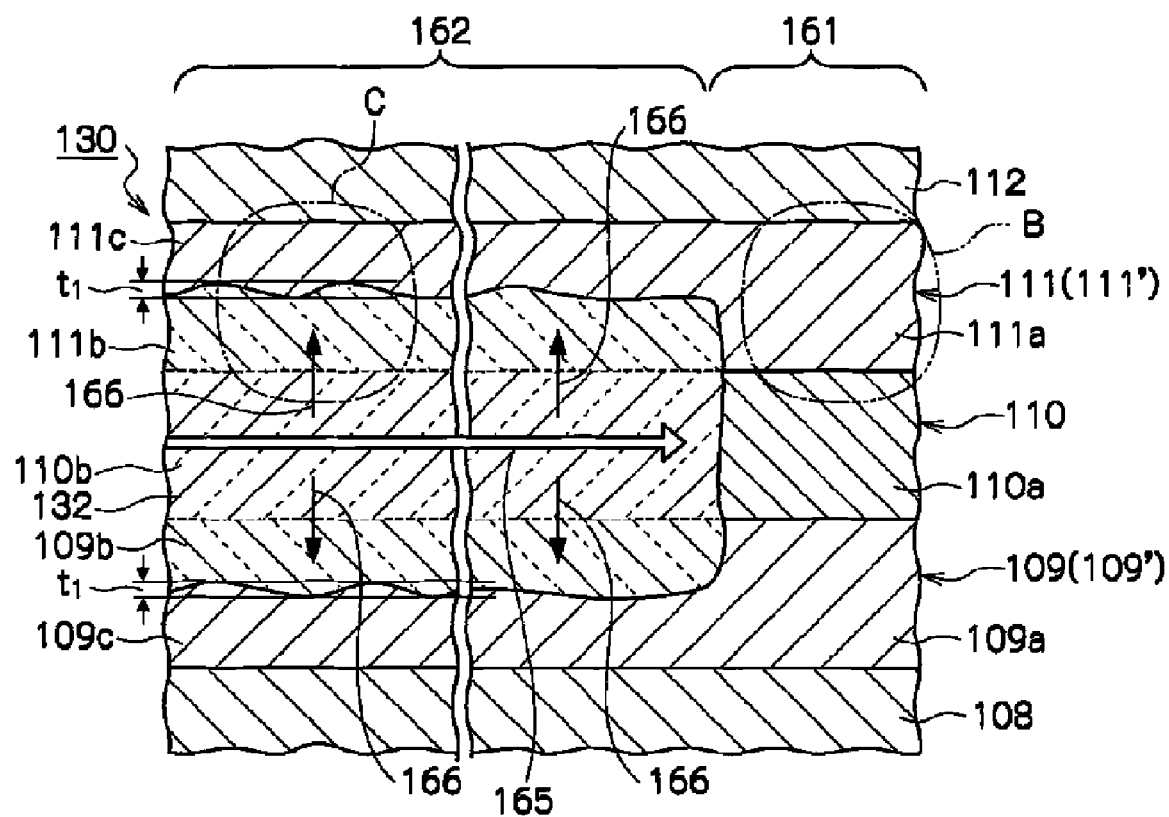
FIG. 2 is an enlarged schematic vertical cross-sectional view of region A shown in FIG. 1.

As shown in FIG. 2, the current confinement layer 110 is made of the current injection portion 110a in the center and the current confinement portion 110b surrounding the current injection portion 110a. The current injection portion 110a is in a center region 161 and the current confinement portion 110b is in a surrounding region 162. The current injection portion 110a is made of $Al_{0.97}Ga_{0.03}As$ and the current confinement portion 110b is made of an oxide whose primary component is Al oxide formed by selectively oxidizing the $Al_{0.97}Ga_{0.03}As$.

The upper pseudo-graded-composition layer 111' includes a semiconductor region 111a positioned in the center region 161 and facing the current injection portion 110a, and an oxide region 111b and a semiconductor region 111c positioned in the surrounding region 162 and facing the current confinement portion 110b.

The semiconductor region 111a contacts the current injection portion 110a and the second p-type spacer layer 112. The oxide region 111b contacts the current confinement portion 110b, and the semiconductor region 111c contacts the oxide region 111b and the second p-type spacer layer 112. The structure of the semiconductor region 111c between the current confinement layer 110 and the interface with the second p-type spacer layer 112 is the same as the structure of the semiconductor region 111a between the current confinement layer 110 and the interface with the second p-type spacer layer 112. The second p-type spacer layer 112 is made of p-type GaAs. The second p-type spacer layer 112 is made of p-type AlGaAs, such as p-type $Al_{0.05}Ga_{0.05}As$.

The lower pseudo-graded-composition layer 109' includes a semiconductor region 109a positioned in the center region 161 and facing the current injection portion 110a, and an oxide region 109b and a semiconductor region 109c positioned in the surrounding region 162 and facing the current confinement portion 110b.

The semiconductor region 109a contacts the current injection portion 110a and the first p-type spacer layer 108. The oxide region 109b contacts the current confinement portion 110b, and the semiconductor region 109c contacts the oxide region 109b and the first p-type spacer layer 108. The structure of the semiconductor region 109c moving from the interface with the first p-type spacer layer 108 toward the current confinement layer 110 is the same as the structure of the semiconductor region 109a moving from the interface with the first p-type spacer layer 108 toward the current confinement layer 110. The topmost layer of the first p-type spacer layer 108 is made of GaAs. The topmost layer of the first p-type spacer layer 108 is made of AlGaAs, such as $Al_{0.05}Ga_{0.95}As$.

The following is a more detailed description of the upper pseudo-graded-composition layer 111'. The structure of the lower pseudo-graded-composition layer 109' between the first p-type spacer layer 108 and the interface with the current confinement layer 110 is the same as the structure of the upper pseudo-graded-composition layer 111' between the second p-type spacer layer 112 and the interface with the current confinement layer 110, and so the following does not include a separate description of the lower pseudo-graded-composition layer 109'. The downward direction is the direction in which the holes move, and therefore the difference between steps is not that important. Accordingly, the upper pseudo-graded-composition layer 111' may be designed to have more upper steps than lower steps, in order to simplify the layering process. Accordingly, when considering the layering process, using 3 to 15 upper steps and 2 to 10 lower steps is desirable. When considering electric resistance, a composition difference between adjacent steps, including layers adjacent to graded-composition layers, no larger than 0.5 is desirable.

Figure 3:
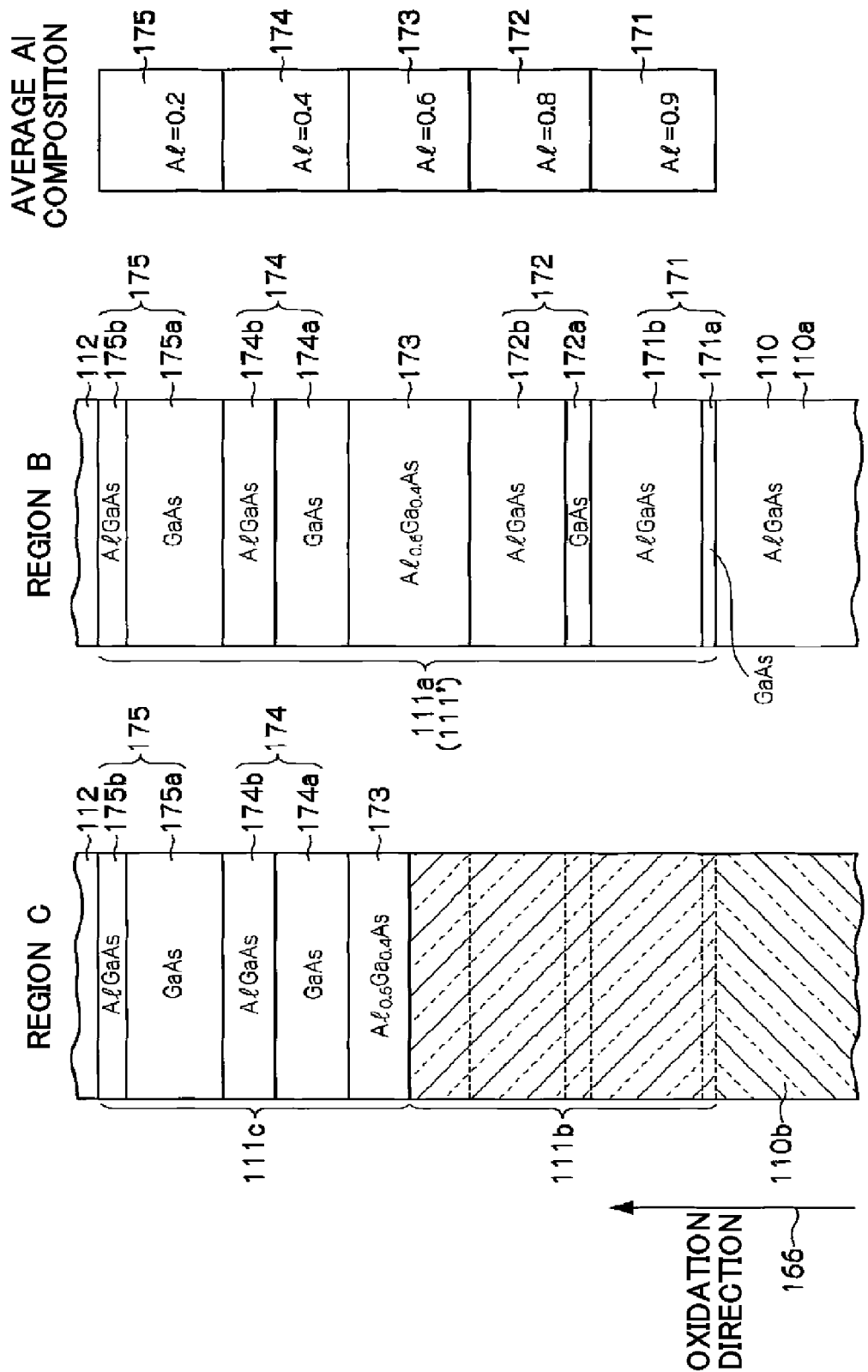
FIG. 3 is an enlarged schematic vertical cross-sectional view of regions B and C shown in FIG. 2 for illustrating a surface emitting laser device according to a first embodiment of the present invention.

As shown in FIG. 3, the semiconductor region 111a of the upper pseudo-graded-composition layer 111' includes four pseudo AlGaAs layers 171, 172, 174, and 175, and an $Al_{0.6}Ga_{0.4}As$ layer 173. The upper pseudo-graded-composition layer 111' has a thickness of 10 nm. Each of the pseudo AlGaAs layers 171, 172, 174, and 175 has a thickness of 2 nm, and the $Al_{0.6}Ga_{0.4}As$ layer 173 has a thickness of 2 nm. The AlGaAs layer 110 (current injection portion 110a) has a thickness of 20 nm.

The pseudo AlGaAs layer 171 is made of a GaAs layer 171a and an AlGaAs layer 171b. The AlGaAs layer 171b is made of $Al_{0.97}Ga_{0.03}As$, and has the same composition as the current injection portion 110a. The GaAs layer 171a has a thickness of approximately 0.21 nm, the AlGaAs layer 171b has a thickness of approximately 1.79 nm, and together the GaAs layer 171a and the AlGaAs layer 171b form the pseudo AlGaAs layer 171 with an average Al composition of 0.9.

The pseudo AlGaAs layer 172 is made of a GaAs layer 172a and an AlGaAs layer 172b. The AlGaAs layer 172b is made of $Al_{0.97}Ga_{0.03}As$. The thickness of the GaAs layer 172a is approximately 0.42 nm, the thickness of the AlGaAs layer 172b is approximately 1.58 nm, and together the GaAs layer 172a and the AlGaAs layer 172b form the pseudo AlGaAs layer 172 with an average Al composition of 0.8.

The $Al_{0.6}Ga_{0.4}As$ layer 173 with an Al composition of 0.6 is disposed between the pseudo AlGaAs layer 172 and the pseudo AlGaAs layer 174.

The pseudo AlGaAs layer 174 is made of a GaAs layer 174a and an AlGaAs layer 174b. The AlGaAs layer 174b is made of $Al_{0.6}Ga_{0.4}As$. The thickness of the GaAs layer 174a is approximately 0.67 nm, the thickness of the AlGaAs layer 174b is approximately 1.33 nm, and together the GaAs layer 174a and the AlGaAs layer 174b form the pseudo AlGaAs layer 174 with an average Al composition of 0.4.

The pseudo AlGaAs layer 175 is made of a GaAs layer 175a and an AlGaAs layer 175b. The AlGaAs layer 175b is made of $Al_{0.6}Ga_{0.4}As$. The thickness of the GaAs layer 175a is approximately 1.33 nm, the thickness of the AlGaAs layer 175b is approximately 0.67 nm, and together the GaAs layer 175a and the AlGaAs layer 175b form the pseudo AlGaAs layer 175 with an average Al composition of 0.2.

In this way, the semiconductor region 111a of the upper pseudo-graded-composition layer 111' includes the AlGaAs layers 171b, 172b, 174b, and 175b with a thickness "a" and the GaAs layers 171a, 172a, 174a, and 175a with a thickness "b" set such that the ratio a/b becomes smaller moving from the AlGaAs layer 110 (current injection portion 110a) toward the second p-type spacer layer 112. As a result, the pseudo Al composition in the pseudo AlGaAs graded-composition layer gradually decreases to become 0.9, 0.8, 0.4, and 0.2. Since the $Al_{0.6}Ga_{0.4}As$ layer 173 with an Al composition of 0.6 is disposed between the pseudo AlGaAs layer 172 with an average Al composition of 0.8 and the pseudo AlGaAs layer 174 with an average Al composition of 0.4, current flows more easily and the current injection efficiency is improved.

The GaAs layers 171a and 172a having the same GaAs composition and the AlGaAs layers 171b and 172b having the same $Al_{0.97}Ga_{0.03}As$ composition are alternately layered with changing thicknesses to form the pseudo AlGaAs layer 171 and the pseudo AlGaAs layer 172. After this, the $Al_{0.6}Ga_{0.4}As$ layer 173 is disposed. The GaAs layers 174a and 175a having the same GaAs composition and the AlGaAs layers 174b and 175b having the same $Al_{0.6}Ga_{0.4}As$ composition are alternately layered with changing thicknesses to form the pseudo AlGaAs layer 174 and the pseudo AlGaAs layer 175. Accordingly, when growing the crystal with MBE, the temperature of the raw material (cell) may be held at a constant temperature before forming the $Al_{0.6}Ga_{0.4}As$ layer 173, and the temperature of the cell can be changed when forming the $Al_{0.6}Ga_{0.4}As$ layer 173 and then held constant at the new temperature. Accordingly, the upper pseudo-graded-composition layer 111' exhibits excellent roughness control and composition profile.

The pseudo AlGaAs layer 174 and the pseudo AlGaAs layer 175 can be formed respectively by the GaAs layers 174a and 175a having the same GaAs composition and the AlGaAs layers 174b and 175b having the same $Al_{0.97}Ga_{0.03}As$ composition. In this case, the thickness of the GaAs layer 174a is set to approximately 1.28 nm and the thickness of the AlGaAs layer 174b is set to approximately 0.72 nm, such that the GaAs layer 174a and the AlGaAs layer 174b form the pseudo AlGaAs layer 174 with an average Al composition of 0.4. Furthermore, in this case, the thickness of the GaAs layer 175a is set to approximately 1.7 nm and the thickness of the AlGaAs layer 175b is set to approximately 0.3 nm, such that the GaAs layer 175a and the AlGaAs layer 175b form the pseudo AlGaAs layer 175 with an average Al composition of 0.2.

The oxide region 111b is made of an oxide whose main component is Al oxide resulting from the oxidizing of the GaAs layer 171a, the AlGaAs layer 171b, the GaAs layer 172a, the AlGaAs layer 172b, and the $Al_{0.6}Ga_{0.4}As$ layer 173.

The structure of the semiconductor region 111c between the current confinement layer 110 and the interface with the second p-type spacer layer 112 is the same as the structure of the semiconductor region 111a between the current confinement layer 110 and the interface with the second p-type spacer layer 112. In other words, both regions include the AlGaAs layer 175b, the GaAs layer 175a, the AlGaAs layer 174b, the GaAs layer 174a, and a portion of the $Al_{0.6}Ga_{0.4}As$ layer 173, in the stated order from the interface with the second p-type spacer layer 112 toward the current confinement layer 110.

The following describes a method for forming the current injection portion 110a via oxidation and also describes the oxide regions 111b and 109b formed as a result.

Figure 4:
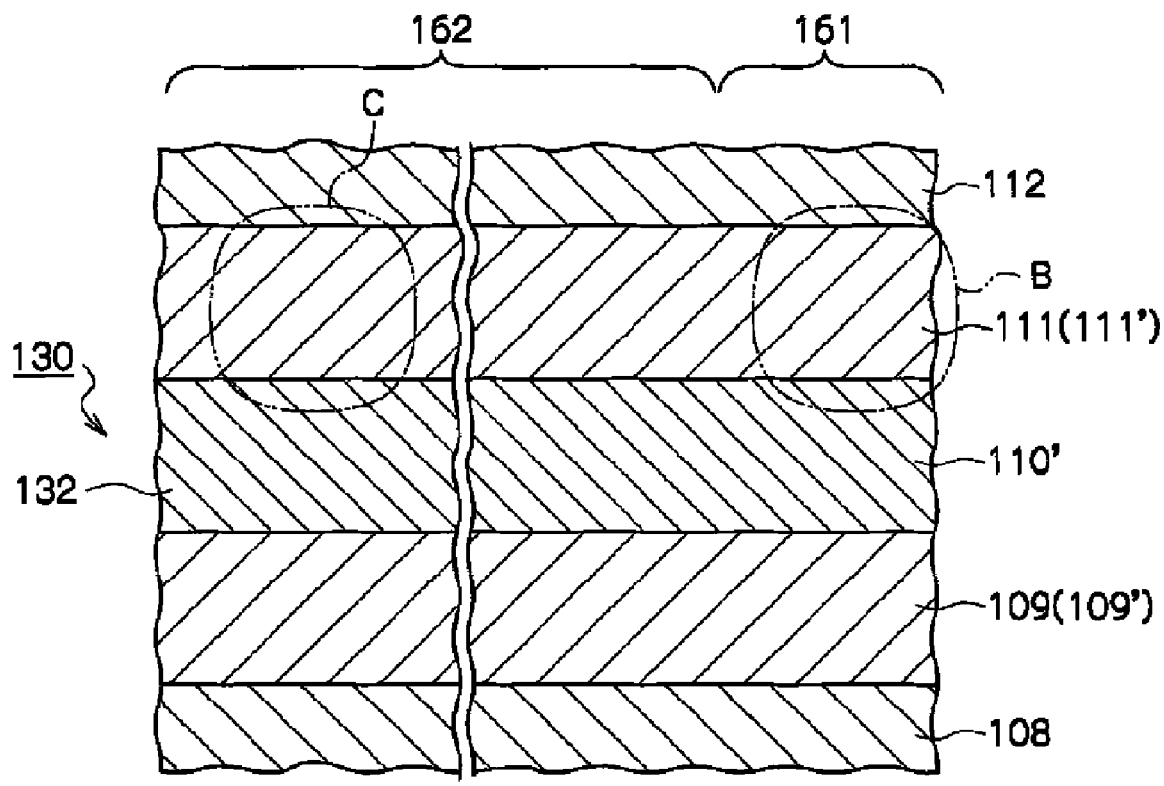
FIG. 4 is an enlarged schematic vertical cross-sectional view of the region A shown in FIG. 1 for illustrating a method of manufacturing the surface emitting laser device according to the first embodiment.
Figure 5:
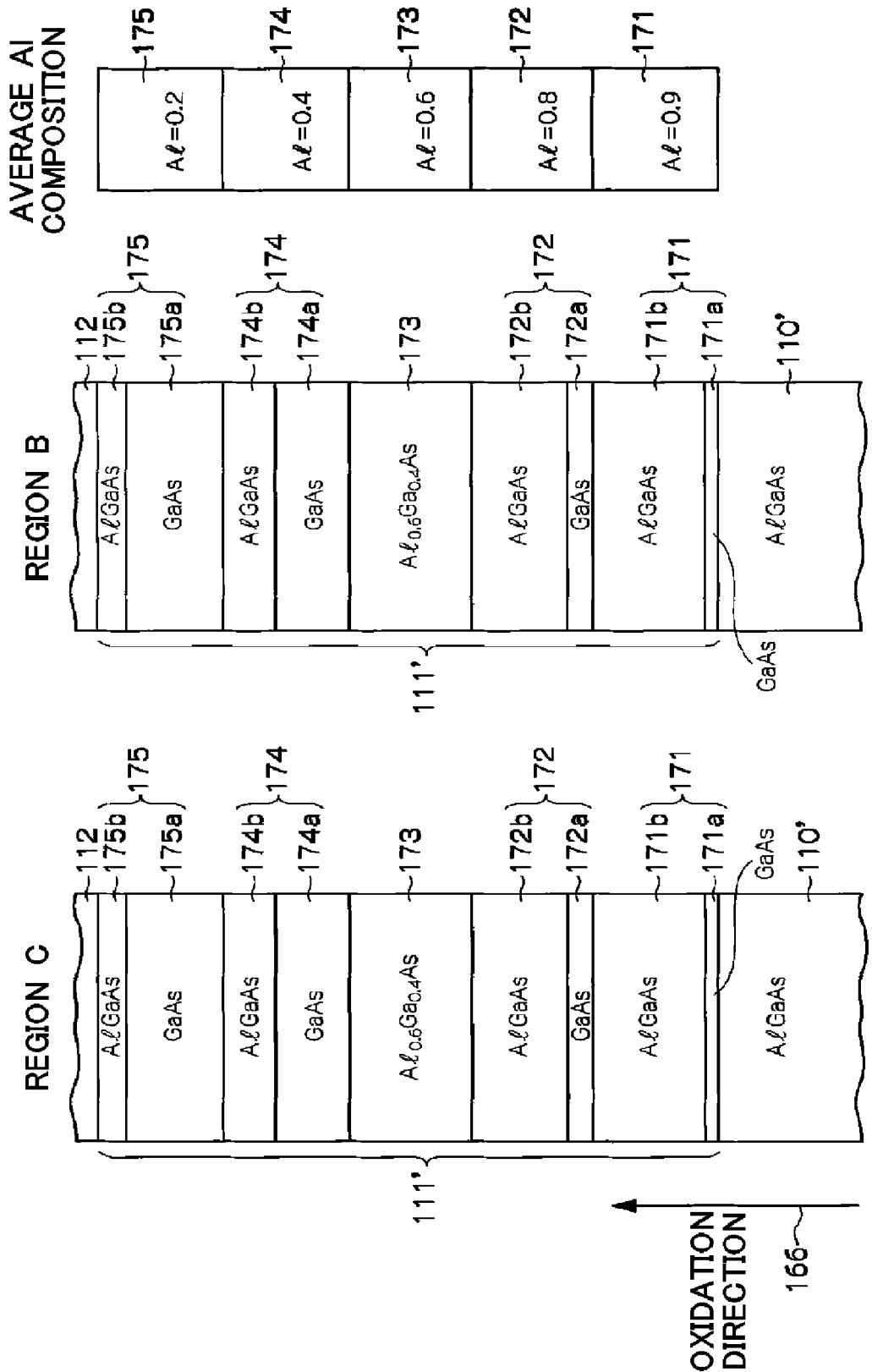
FIG. 5 is an enlarged schematic vertical cross-sectional view of the regions B and C shown in FIG. 4.

As shown in FIGS. 4 and 5, the GaAs layer 171a, the upper pseudo-graded-composition layer 111' including the AlGaAs layer 171b, the GaAs layer 172a, the AlGaAs layer 172b, the $Al_{0.6}Ga_{0.4}As$ layer 173, the GaAs layer 174a, the AlGaAs layer 174b, the GaAs layer 175a, and the AlGaAs layer 175b is formed on the $Al_{0.97}Ga_{0.03}As$ layer 110'. The lower pseudo-graded-composition layer 109' having the same structure is formed below the $Al_{0.97}Ga_{0.03}As$ layer 110'.

A thermal processing is performed in a water vapor atmosphere for 1 hour at a temperature of 450° C. As a result, as shown in FIG. 2, the $Al_{0.97}Ga_{0.03}As$ layer 110' is oxidized from the side surface 132 of the mesa post 130 along an oxidation direction 165, thereby forming the current confinement portion 110b by changing the $Al_{0.97}Ga_{0.03}As$ layer into an oxide layer whose primary component is $Al_2O_3$. The chemical reaction progresses uniformly from the circumference of the $Al_{0.97}Ga_{0.03}As$ layer 110', until only the current injection portion 110a of $Al_{0.97}Ga_{0.03}As$ remains in the center. At this time, the oxidation also progresses in an oxidation direction 166, to oxidize the GaAs layer 171a, the AlGaAs layer 171b, the GaAs layer 172a, the AlGaAs layer 172b, and a portion of the $Al_{0.6}Ga_{0.4}As$ layer 173, i.e. the $Al_{0.97}Ga_{0.03}As$ layer 110' side of the $Al_{0.6}Ga_{0.4}As$ layer 173, thereby forming the oxide region 111b. The oxide region 109b is formed in the same way.

A second embodiment of the present invention relates to a surface emitting laser that is suitable for manufacturing by the MOCVD, and to a manufacturing method thereof.

The MOCVD differs from the MBE in that the composition of AlGaAs can be changed by controlling the flow rate of raw material gas, and therefore the MOCVD can be used to easily form the AlGaAs graded-composition layer in which the aluminum composition changes continuously. Accordingly, the second embodiment uses an upper graded-composition layer 111 in which the Al composition ratio decreases linearly from the current injection portion 110a of the current confinement layer 110 to the second p-type spacer layer 112 and a lower graded-composition layer 109 in which the Al composition ratio decreases linearly from the current injection portion 110a of the current confinement layer 110 to the topmost layer of the active layer 106.

Figure 6:
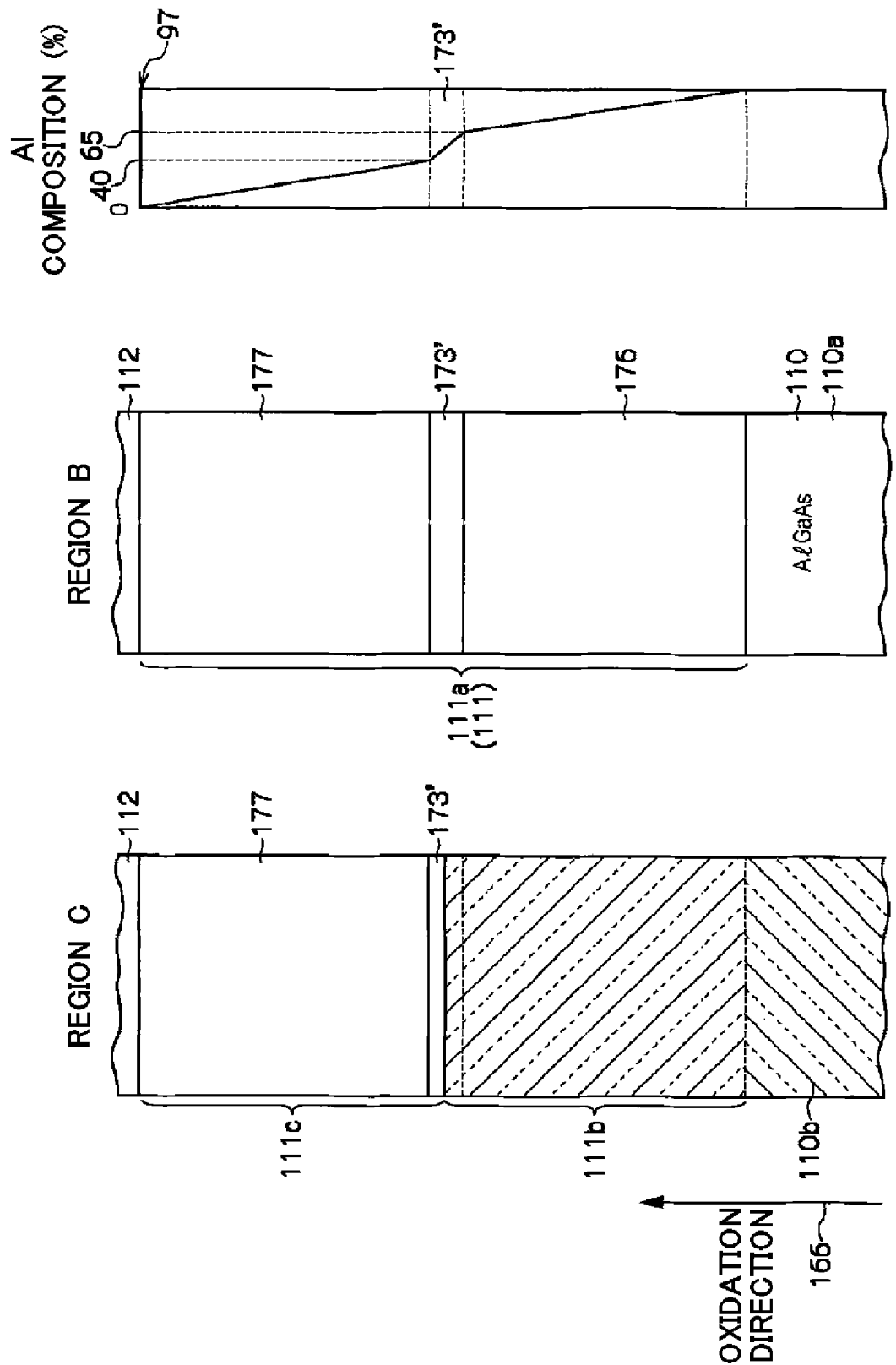
FIG. 6 is an enlarged schematic vertical cross-sectional view of regions B and C shown in FIG. 2 for illustrating a surface emitting laser device according to a second embodiment of the present invention.

The following is a detailed description of the lower graded-composition layer 109 and the upper graded-composition layer 111 according to the second embodiment, referencing FIGS. 2 and 6.

The current confinement layer 110 is the same as in the first embodiment, and therefore the description is omitted.

The upper graded-composition layer 111 includes a semiconductor region 111a positioned in a center region 161 and facing the current injection portion 110a, and an oxide region 111b and semiconductor region 111c positioned in a surrounding region 162 and facing the current confinement portion 110b.

The semiconductor region 111a contacts the current injection portion 110a and the second p-type spacer layer 112. The oxide region 111b contacts the current confinement portion 110b, and the semiconductor region 111c contacts the oxide region 111b and the second p-type spacer layer 112. The structure of the semiconductor region 111c between the current confinement layer 110 and the interface with the second p-type spacer layer 112 is the same as the structure of the semiconductor region 111a between the current confinement layer 110 and the interface with the second p-type spacer layer 112. The second p-type spacer layer 112 is made of p-type GaAs.

The lower graded-composition layer 109 includes a semiconductor region 109a positioned in the center region and facing the current injection portion 110a, and an oxide region 109b and a semiconductor region 109c positioned in the surrounding region 162 and facing the current confinement portion 110b.

The semiconductor region 109a contacts the current injection portion 110a and the first p-type spacer layer 108. The oxide region 109b contacts the current confinement portion 110b, and the semiconductor region 109c contacts the oxide region 109b and the first p-type spacer layer 108. The structure of the semiconductor region 109c moving from the interface with the first p-type spacer layer 108 toward the current confinement layer 110 is the same as the structure of the semiconductor region 109a moving from the interface with the first p-type spacer layer 108 toward the current confinement layer 110. The topmost layer of the first p-type spacer layer 108 is made of GaAs.

The following is a more detailed description of the upper graded-composition layer 111. The structure of the lower graded-composition layer 109 between the first p-type spacer layer 108 and the interface with the current confinement layer 110 is the same as the structure of the upper graded-composition layer 111 between the second p-type spacer layer 112 and the interface with the current confinement layer 110, and so the following does not include a separate description of the lower graded-composition layer 109. However, the lower graded-composition layer 109 may instead have a different configuration.

As shown in FIG. 6, the semiconductor region 111a of the upper graded-composition layer 111 includes a graded-composition layer 176, an oxidation stop layer 173', and a graded-composition layer 177. The upper graded-composition layer 111 has a thickness of 10 nm, the graded-composition layer 176 has a thickness of 7.2 nm, the oxidation stop layer 173' has a thickness of 2 nm, and the graded-composition layer 176 has a thickness of 10.8 nm. The AlGaAs layer 110 (current injection portion 110a) has a thickness of 20 nm.

In the graded-composition layer 176, the Al composition ratio decreases linearly from 0.97, which is the same as the Al composition of the $Al_{0.97}Ga_{0.03}As$ of the current injection portion 110a, to 0.65, which is the upper limit of the oxidation stop layer 173', from the current injection portion 110a toward the $Al_{0.6}Ga_{0.4}As$ layer 173. In the oxidation stop layer 173', the Al composition ratio decreases in units from the upper limit of 0.65 to 0.4. In the Specification, the phrase "decrease in units" means that regions in which the Al composition ratio does not decrease may be included. In the graded-composition layer 177, the Al composition ratio decreases linearly from 0.4, which is the lower limit of the oxidation stop layer 173', to 0, which is the same as the Al composition of the GaAs in the second p-type spacer layer 112, from the oxidation stop layer 173' toward the second p-type spacer layer 112. The rate of change of the Al composition ratio with respect to distance from the current confinement layer in the oxidation stop layer 173' may be larger than the rate of change of the Al composition ratio with respect to distance from the current confinement layer in the graded-composition layer 176.

In the graded-composition layer 176, the Al composition ratio may linearly decrease from a composition ratio that is slightly less than 0.97 Al composition ratio of the $Al_{0.97}Ga_{0.03}As$ of the current injection portion 110a to a composition ratio that is larger than the 0.65 Al composition of the oxidation stop layer 173', from the current injection portion 110a toward the oxidation stop layer 173'. For example, in the graded-composition layer 176, the Al composition may linearly decrease from 0.95 to 0.7. Furthermore, this decrease of the Al composition ratio need not be linear. In the graded-composition layer 177, the Al composition ratio may linearly decrease from a composition ratio that is less than the 0.4 Al composition ratio of the oxidation stop layer 173' to a composition ratio that is larger than the 0 Al composition of GaAs of the second p-type spacer layer 112, from the oxidation stop layer 173' toward the second p-type spacer layer 112. For example, in the graded-composition layer 177, the Al composition may linearly decrease from 0.35 to 0.1. Furthermore, this decrease of the Al composition ratio need not be linear.

In this way, the upper graded-composition layer 111 includes the graded-composition layer 176 in which the Al composition decreases from 0.97, which is the same as the Al composition of the $Al_{0.97}Ga_{0.03}As$ of the current injection portion 110a, to 0.65, the oxidation stop layer 173' in which the Al composition ratio linearly decreases from 0.65 to 0.4, and the graded-composition layer 177 in which the Al composition ratio decreases linearly from 0.4 to 0, which is the same as the Al composition of the second p-type spacer layer 112. A graded-composition layer 178, the oxidation stop layer 173', and the graded-composition layer 177 are disposed in the stated order from the current injection portion 110a of $Al_{0.97}Ga_{0.03}As$ to the second p-type spacer layer 112 of p-type GaAs.

The rate of change of the Al composition ratio is larger in the oxidation stop layer 173' than in the graded-composition layer 176, and therefore the degree of oxidation decreases with respect to change in the thickness direction. Accordingly, the variation in the thickness direction among the positions at which the oxidation stops in the oxidation stop layer 173' is decreased, thereby decreasing the effect of oxidation speed variation in the thickness direction. As a result, the variation t1 of the border between the oxide region 111b and the non-oxidized semiconductor region 111c is decreased, as is the meander of this border, thereby reducing the chance of local strain. Therefore, in the upper graded-composition layer 111, current flows easily and the current injection efficiency is improved.

The oxide region 111b is an oxide whose primary component is Al oxide resulting from the oxidation of the graded-composition layer 176 and a portion of the oxidation stop layer 173'.

The structure of the semiconductor region 111c between the current confinement layer 110 and the interface with the second p-type spacer layer 112 is the same as the structure of the semiconductor region 111a between the current confinement layer 110 and the interface with the second p-type spacer layer 112. In other words, both regions include the graded-composition layer 177 and a portion of the oxidation stop layer 173' from the interface with the second p-type spacer layer 112 toward the current confinement layer 110.

The following describes a method for forming the current injection portion 110a via oxidation and also describes the oxide regions 111b and 109b formed as a result.

Figure 7:
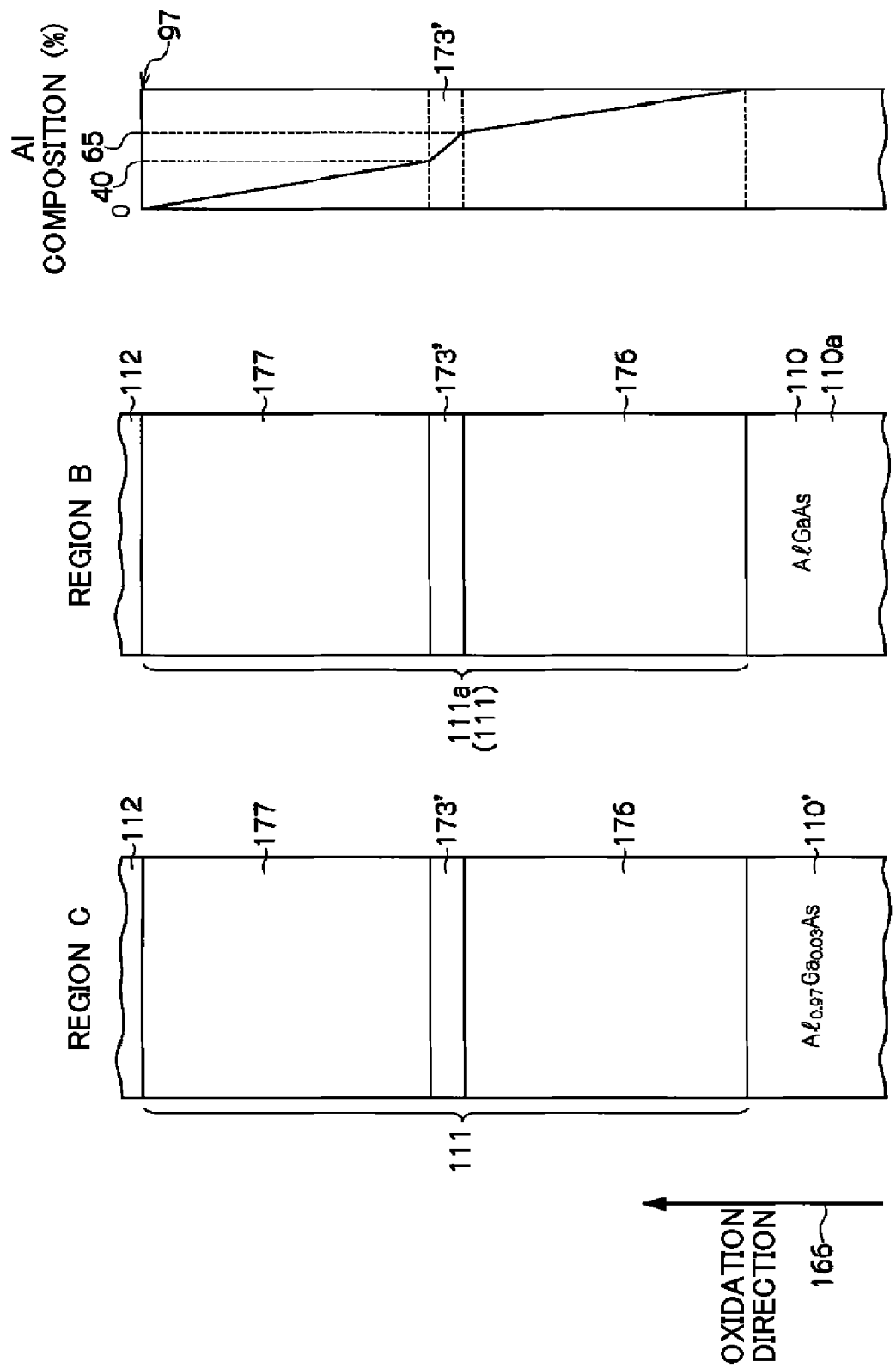
FIG. 7 is an enlarged schematic vertical cross-sectional view of regions B and C shown in FIG. 4 for illustrating a method of manufacturing the surface emitting laser device according to the second embodiment.

As shown in FIGS. 4 and 7, the upper graded-composition layer 111 including the graded-composition layer 176, the oxidation stop layer 173', and the graded-composition layer 177 is formed on the $Al_{0.97}Ga_{0.03}As$ layer 110'. The lower graded-composition layer 109 having the same structure is formed below the $Al_{0.97}Ga_{0.03}As$ layer 110'.

A thermal processing is performed then in a water vapor atmosphere for 1 hour at a temperature of 450° C. As a result, as shown in FIG. 2, the $Al_{0.97}Ga_{0.03}As$ layer 110' is oxidized from the side surface 132 of the mesa post 130 in the oxidation direction 165, thereby forming the current confinement portion 110b by changing the $Al_{0.97}Ga_{0.03}As$ layer into an oxide layer whose primary component is Al oxide. The chemical reaction progresses approximately uniformly from the circumference of the $Al_{0.97}Ga_{0.03}As$ layer 110', until only the current injection portion 110a of $Al_{0.97}Ga_{0.03}As$ remains in the center. At this time, the oxidation also progresses in the oxidation direction 166 to oxidize the graded-composition layer 176 and a portion of the oxidation stop layer 173' (the Al$_{0.97}$Ga$_{0.03}$As layer 110' side), thereby forming the oxide region 111b. The oxide region 109b is formed in the same way.

Figure 9:
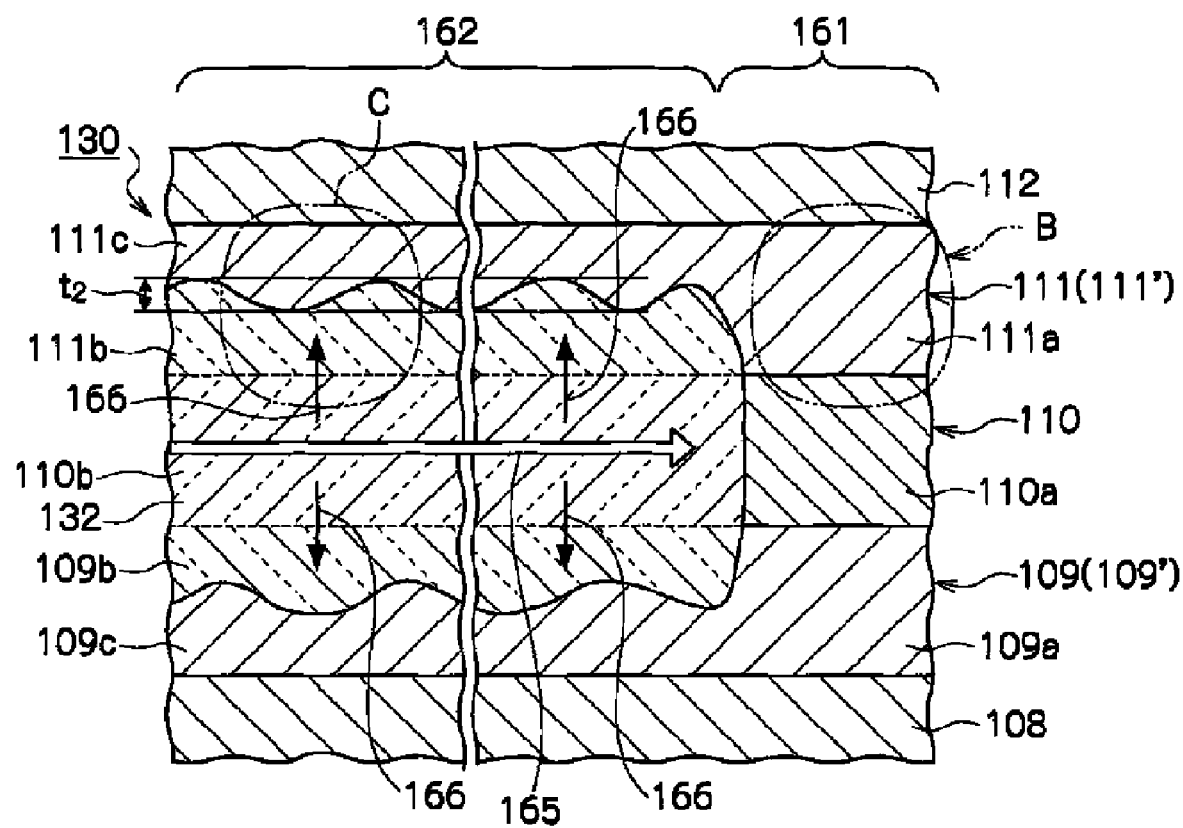
FIG. 9 is an enlarged schematic vertical cross-sectional view of a portion corresponding to region A shown in FIG. 1 for illustrating a first comparative example.
Figure 10:
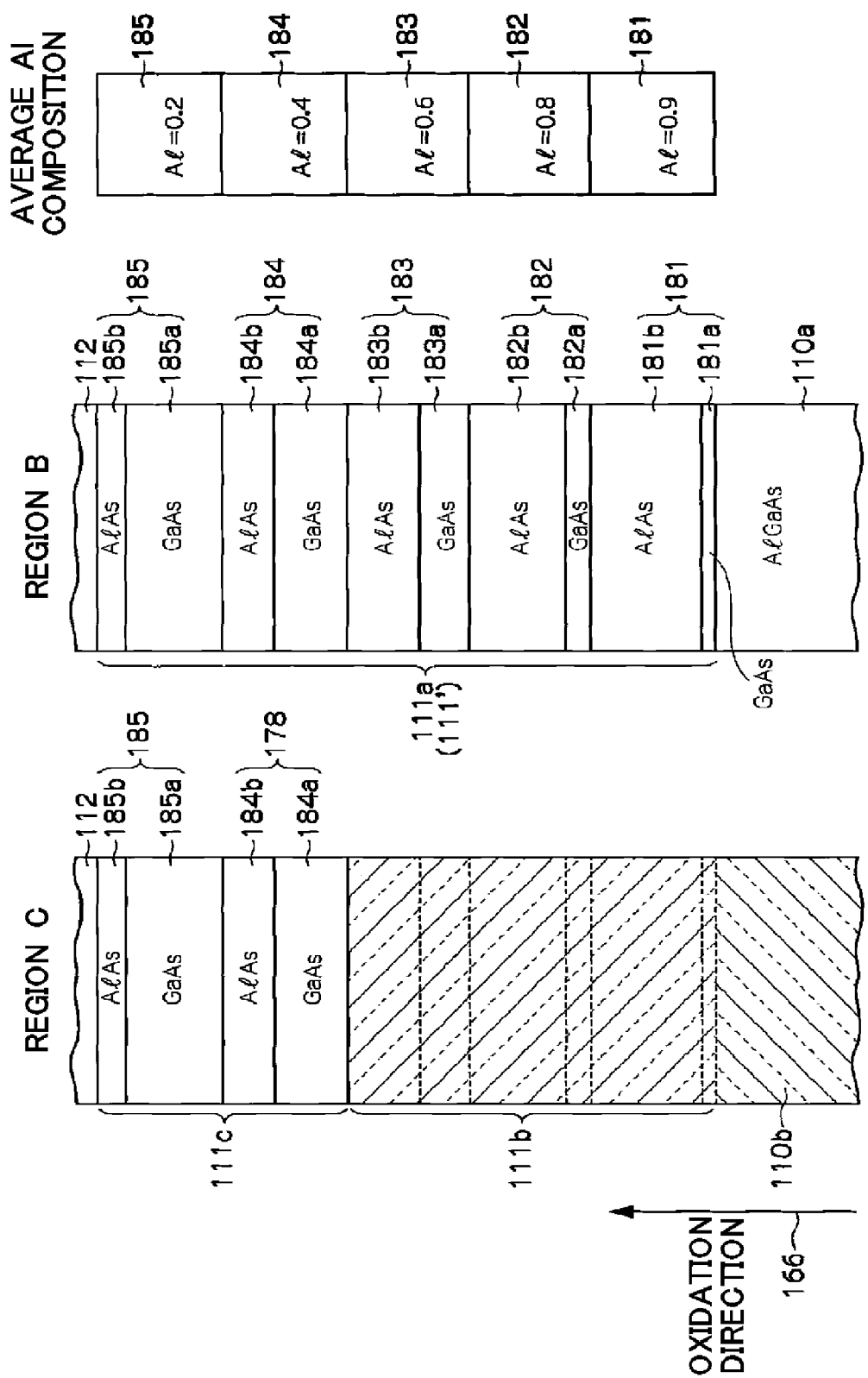
FIG. 10 is an enlarged schematic vertical cross-sectional view for describing regions B and C shown in FIG. 9.

The following describes a structure and manufacturing method of a semiconductor laser device of a first comparative example. In the first embodiment described above, the semiconductor region 111a of the upper pseudo-graded-composition layer 111' is formed of the Al$_{0.6}$Ga$_{0.4}$As layer 173 and the pseudo AlGaAs layers 171, 172, 174, and 175 formed by alternately layering the GaAs layers 171a, 172a, 174a, and 175a and the AlGaAs layers 171b, 172b, 174b, and 175b while changing the thicknesses thereof. As shown in FIGS. 9 and 10, in the first comparative example, a semiconductor region 111a of an upper pseudo-graded-composition layer 111' is formed by alternately layering GaAs layers 181a, 182a, 183a, 184a, 185a, having the same composition and AlAs layers 181b, 182b, 183b, 184b, and 185b having the same composition, while changing the thicknesses thereof.

In the first comparative example, a pseudo AlGaAs layer 181 with an average Al composition of 0.9 is formed by the GaAs layer 181a with a thickness of 0.25 nm and the AlAs layer 181b with a thickness of 2.25 nm. A pseudo AlGaAs layer 182 with an average Al composition of 0.8 is formed by the GaAs layer 182a with a thickness of 0.5 nm and the AlAs layer 182b with a thickness of 2 nm. A pseudo AlGaAs layer 183 with an average Al composition of 0.6 is formed by the GaAs layer 183a with a thickness of 1 nm and the AlAs layer 183b with a thickness of 1.5 nm. A pseudo AlGaAs layer 184 with an average Al composition of 0.4 is formed by the GaAs layer 184a with a thickness of 1.5 nm and the AlAs layer 184b with a thickness of 1 nm. A pseudo AlGaAs layer 185 with an average Al composition of 0.2 is formed by the GaAs layer 185a with a thickness of 2 nm and the AlAs layer 185b with a thickness of 0.5 nm. The first comparative example differs from the first embodiment in the points described above and in that the semiconductor region 109a of the lower pseudo-graded-composition layer 109 has the same structure as the semiconductor region 111a of the upper pseudo-graded-composition layer 111, but other points are the same.

Figure 11:
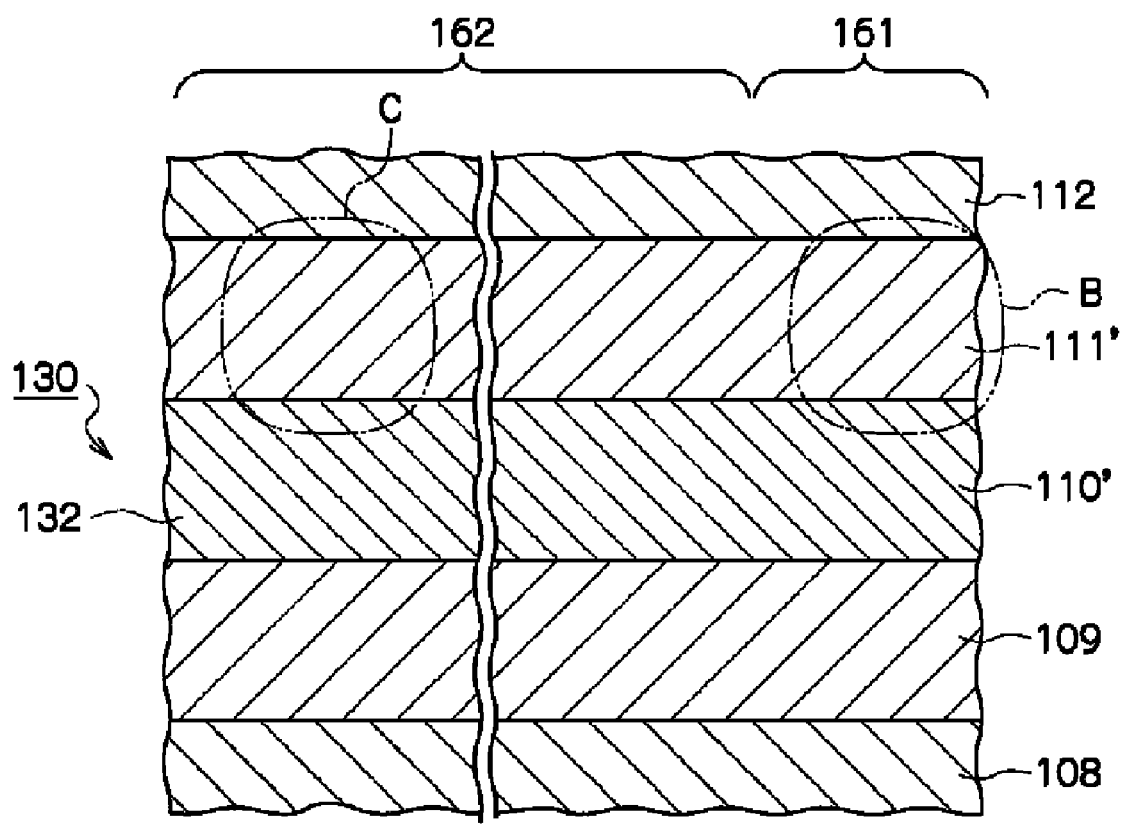
FIG. 11 is an enlarged schematic vertical cross-sectional view of a portion corresponding to region A shown in FIG. 1 for illustrating a method of manufacturing surface emitting laser devices of the first comparative example and a second comparative example.
Figure 12:
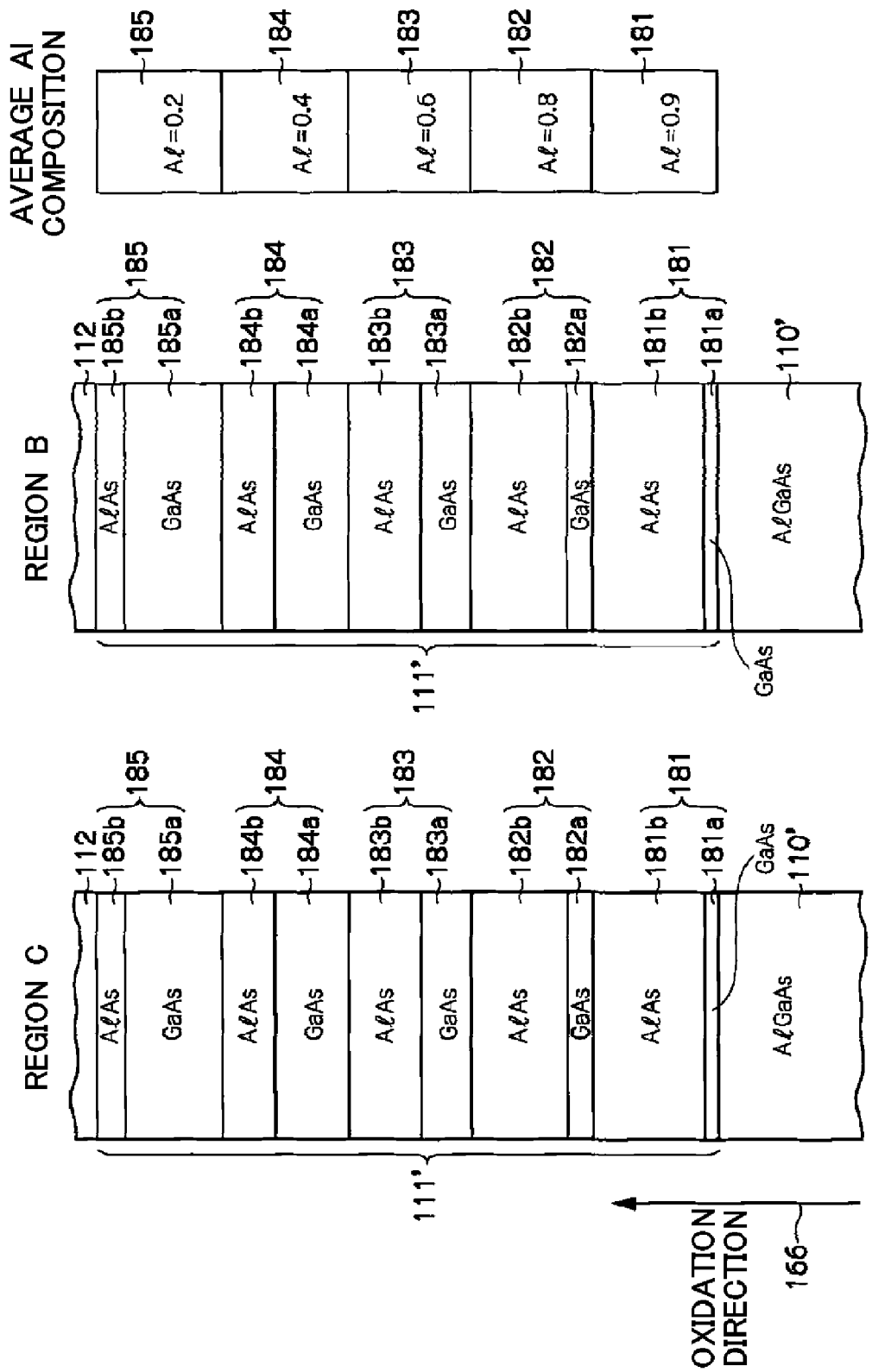
FIG. 12 is an enlarged schematic vertical cross-sectional view regions B and C shown in FIG. 11 for illustrating the method of manufacturing the surface emitting laser device of the first comparative example.

In the first comparative example, as shown in FIGS. 11 and 12, an upper pseudo-graded-composition layer 111', which includes the GaAs layer 181a, the AlAs layer 181b, the GaAs layer 182a, the AlAs layer 182b, the GaAs layer 183a, the AlAs layer 183b, the GaAs layer 184a, the AlAs layer 184b, the GaAs layer 185a, and the AlAs layer 185b is formed on an Al$_{0.97}$Ga$_{0.03}$As layer 110'. A lower pseudo-graded-composition layer 109 having the same structure is formed below the Al$_{0.97}$Ga$_{0.03}$As layer 110'.

A thermal processing is performed then in a water vapor atmosphere for 1 hour at a temperature of 450° C. As a result, as shown in FIGS. 9 and 10, the Al$_{0.97}$Ga$_{0.03}$As layer 110' is oxidized from the side surface 132 of the mesa post 130 in the oxidation direction 165, thereby forming the current confinement portion 110b by changing the Al$_{0.97}$Ga$_{0.03}$As layer into an oxide layer whose primary component is Al$_2$O$_3$. At this time, the oxidation also progresses in the oxidation direction 166 to oxidize the GaAs layer 181a, the AlAs layer 181b, the GaAs layer 182a, the AlAs layer 182b, the GaAs layer 183a, and the AlAs layer 183b, thereby forming the oxide region 111b. The oxide region 109b is formed in the same way.

In the first comparative example, the thin GaAs layers 181a, 182a, etc. function as oxidation barriers. When the thin GaAs layer 181a is oxidized, the oxidation occurs quickly because of the high oxidation speed of the AlAs layer 181b, and the oxidation reaches the next GaAs layer 182a. Then, when the thin GaAs layer 182a is oxidized, the oxidation occurs quickly because of the high oxidation speed of the AlAs layer 182b, and the oxidation reaches the next GaAs layer 183a. As a result, the variation in thickness of the thin GaAs layers 181a, 182a, etc. affects the oxidation speed in the thickness direction. Therefore, as shown in FIG. 6, the variation t2 of the border between the oxide region 111b and the non-oxidized semiconductor region 111c is large, as is the meander of this border, and so the local strains can occur easily. Furthermore, AlAs is a fragile material, and so there is a large amount of contraction during oxidation, resulting in stress-strain. The stress-strain leads to dislocations in the crystal that proliferate when the device performs long-term conduction, and therefore severely decreases the reliability of the device. In this way, the fragile AlAs increases the occurrence of strain, which can cause peeling of the current confinement portion 110b, for example, thereby damaging the mesa post 130.

In contrast, the AlGaAs used in the first embodiment has greater crystal strength than AlAs, and including even a small amount of Ga in AlAs dramatically increases the strength. Furthermore, AlGaAs is a material whose oxidation rate decreases by approximately 30% just by changing the Al composition by 1%. Accordingly, By combining AlGaAs and GaAs in the manner described in the first embodiment to form the upper pseudo-graded-composition layer 111' and the lower pseudo-graded-composition layer 109', the low oxidation speed of the AlGaAs layers 171b, 172b, etc. prevent quick oxidation, thereby reducing the effect of the oxidation speed in the thickness direction caused by the thickness variations in the thin GaAs layers 171a, 172a, etc.

Furthermore, by including the Al$_{0.6}$Ga$_{0.4}$As layer 173, the oxidation is stopped by the Al$_{0.6}$Ga$_{0.4}$As layer 173. In the Al$_{0.6}$Ga$_{0.4}$As layer 173, the rate of change of the Al composition ratio is higher than in adjacent layers, and therefore the degree of oxidation decreases with respect to change in the thickness direction. Accordingly, the variation in the thickness direction of the positions at which the oxidation is stopped by the Al$_{0.6}$Ga$_{0.4}$As layer 173 decreases, and therefore the effect of the variation of oxidation speed in the thickness direction is further reduced.

As a result, as shown in FIG. 2, the variation t1 of the border between the oxide region 111b and the non-oxidized semiconductor region 111c is decreased, as is the meander of this border, thereby reducing the chance of local strain. Since AlGaAs has greater crystal strength than AlAs, the resulting structure has superior mechanical strength, and so a device with high reliability can be realized. Furthermore, the embodiments of the present invention can effectively control the borders with the oxidized portions to have a width no larger than 2 nm near the interfaces between this stop layer and the AlGaAs layers. Therefore, the AlGaAs layers can be designed as a portion of the oxidized current confinement layer. In this case, the oxidized current confinement layer is set to be between 2 nm and 8 nm.

Figure 13:
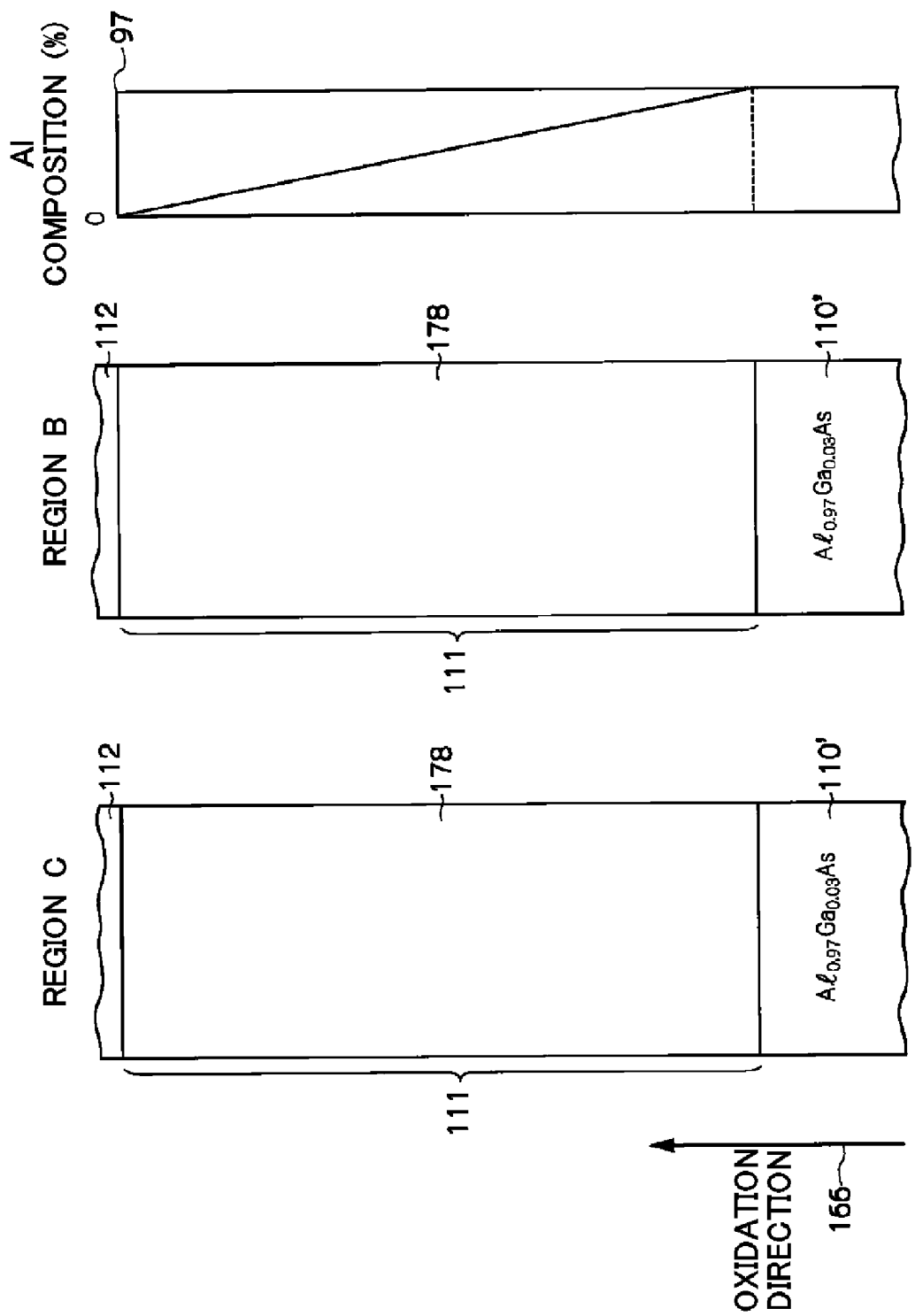
FIG. 13 is an enlarged schematic vertical cross-sectional view of regions B and C shown in FIG. 11 for illustrating the method of manufacturing the surface emitting laser device of the second comparative example.

The following describes a structure of a second comparative example. In the second embodiment, the semiconductor region 111a of the upper graded-composition layer 111 is formed of the graded-composition layer 176 in which the Al composition ratio decreases linearly from 0.97, which is the same as the Al composition of the Al$_{0.97}$Ga$_{0.03}$As of the current injection portion 110a, to 0.65, the oxidation stop layer 173' in which the Al composition ratio linearly decreases from 0.65 to 0.4, and the graded-composition layer 177 in which the Al composition ratio decreases linearly from 0.4 to 0, which is the same as the Al composition of the GaAs in the second p-type spacer layer 112. As shown in FIG. 13, the second comparative example differs from the second embodiment in that the upper graded-composition layer 111 is formed of the graded-composition layer 178 in which the Al composition ratio decreases linearly from 0.97, which is the same as the Al composition of the $Al_{0.97}Ga_{0.03}As$ of the current injection portion 110a, to 0, which is the same as the Al composition of the GaAs in the second p-type spacer layer 112. Furthermore, the lower graded-composition layer 109 has the same structure as the upper graded-composition layer 111. Aside from these differences, the second comparative example is the same as the second embodiment.

In the second comparative example, thermal processing is performed in a water vapor atmosphere for 1 hour at 450° C. As a result the $Al_{0.97}Ga_{0.03}As$ layer 110' is oxidized from the side surface 132 of the mesa post 130, thereby forming the current confinement portion 110b by changing the $Al_{0.97}Ga_{0.03}As$ layer into an oxide layer whose primary component is Al oxide. At this time, the oxidation also progresses in the thickness direction to oxidize part of the graded-composition layer 178 thereby forming the oxide region 111b. The oxide region 109b is formed in the same way.

In contrast, the second embodiment includes the oxidation stop layer 173', in which the Al composition ratio suddenly changes from 0.65 to 0.4, between the graded-composition layer 176 in which the Al composition ratio decreases linearly from 0.97, which is the same as the Al composition of the $Al_{0.97}Ga_{0.03}As$ of the current injection portion 110a, to 0.65 and the graded-composition layer 177 in which the Al composition ratio decreases linearly from 0.4 to 0, which is the same as the Al composition of the GaAs in the second p-type spacer layer 112. Therefore, the oxidation is stopped by the oxidation stop layer 173' and, as shown in FIG. 2, the variation t1 of the border between the oxide region 111b and the non-oxidized semiconductor region 111c is decreased, as is the meander of this border, thereby reducing the chance of local strain. In the embodiments, an Al composition ratio from 0.65 to 0.4 is used as an example of the most preferable Al composition ratio range in the oxidation stop layer, but the variation t1 can be further decreased by selecting the Al compositions ratios within a range from 0.8 to 0.4 for the oxidation stop layer. In this case, the lower limit should be between 0.65 and 0.4. The composition change within the oxidation stop layer is preferably no larger than 0.3, and the thickness of the oxidation stop layer is preferably no less that ⅓ the thickness of the graded-composition layer. Furthermore, the graded-composition layer 176 is preferably ⅓ to ⅕ of the graded-composition layer.

Figure 8A:
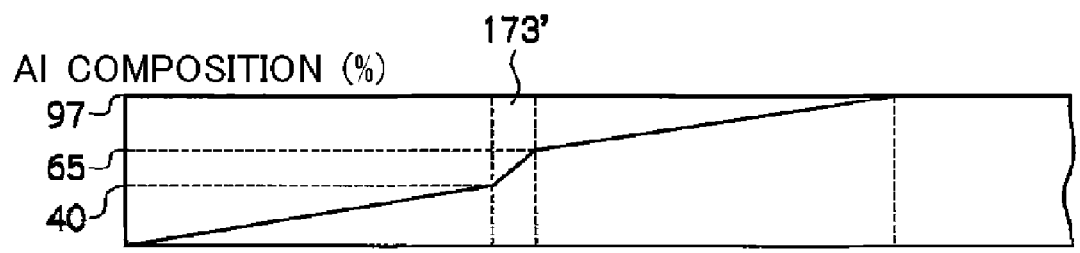
FIGS. 8a, 8b and 8c are an enlarged schematic vertical cross-sectional view for describing an oxidation stop layer of the surface emitting laser device according to the second embodiment.
Figure 8B:
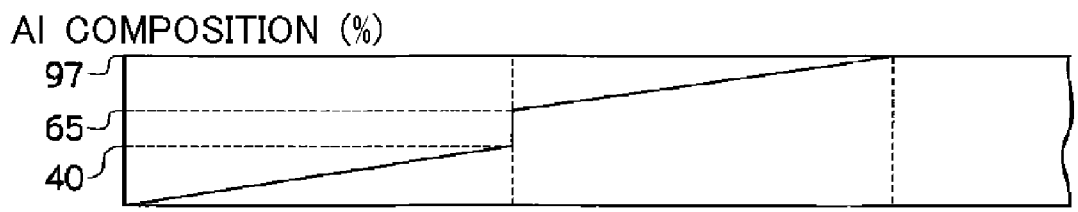
Figure 8C:
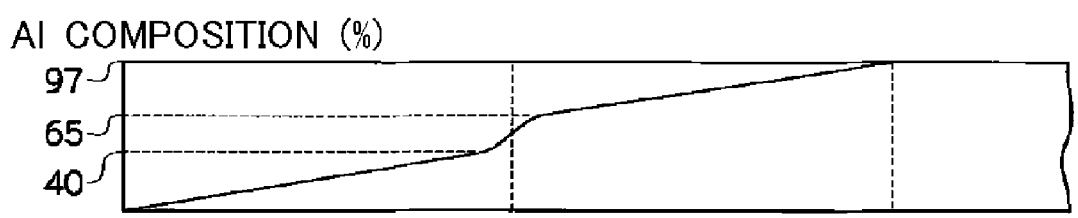

FIGS. 8A and 8B show examples of composition changes in the oxidation stop layer 173'. FIG. 8A shows a graded-composition profile of the second embodiment. FIG. 8B shows an example in which the Al composition drops suddenly from 0.65 to 0.4. FIG. 8C shows an example in which the change follows a curve with an inflection point between 0.65 and 0.4. The curvature rate can be determined based on the desired variation t1 and electric barriers.

Figure 14:
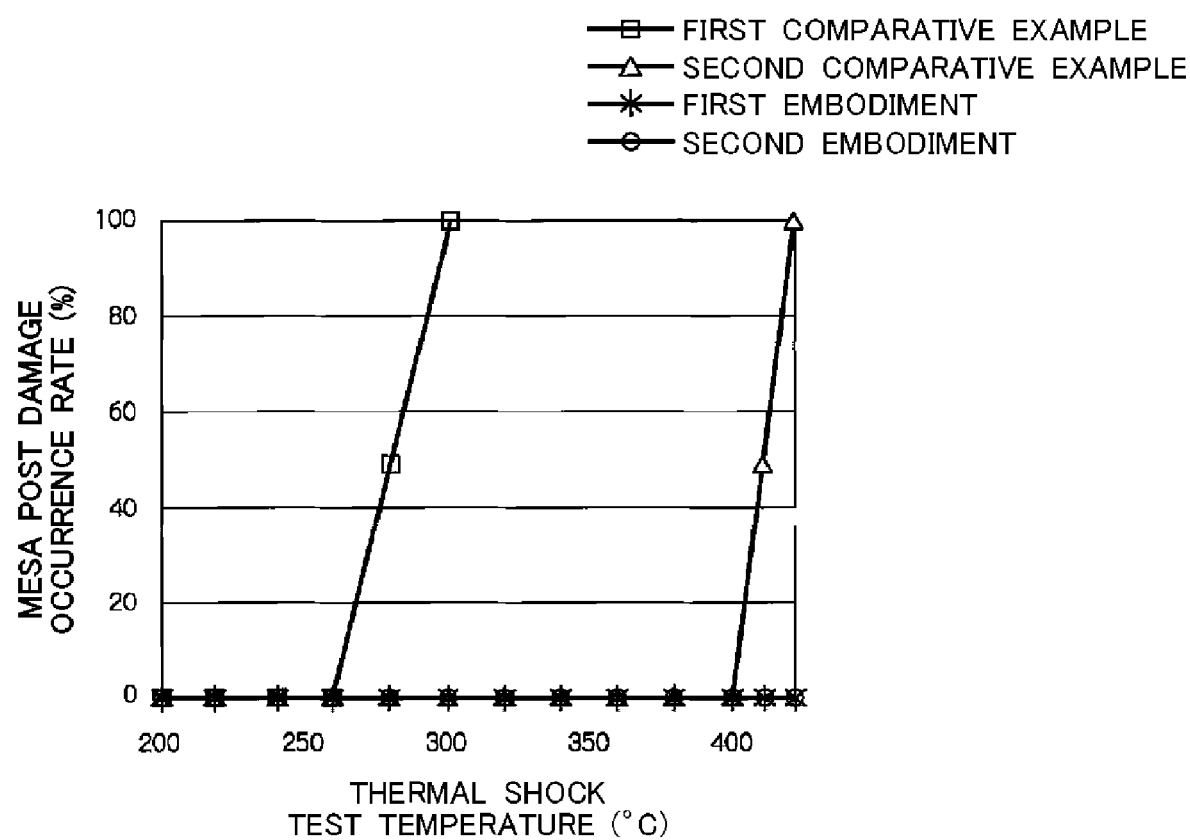
FIG. 14 shows a relationship between thermal shock test temperature and occurrence of damage to the mesa post for the surface emitting laser devices according to the first and second embodiments and the surface emitting laser devices of the first and second comparative examples.

FIG. 14 shows a relationship between thermal shock test temperature and occurrence of damage to the mesa post, obtained from results of performing thermal shock tests on the laser devices of the first and second embodiments and the laser devices of the first and second comparative examples. In the laser devices of the first comparative example, the mesa post damage began to occur near 250° C., and near 300° C. almost all of the test pieces exhibited mesa post damage. In the laser devices of the second comparative example, the mesa post damage began to occur near 400° C., and near 410° C. almost all of the test pieces exhibited mesa post damage. In contrast, for the laser devices of the first and second embodiments, none of the test pieces exhibited mesa post damage, even at 420° C. If mesa post damage does not occur at 420° C., then it is believed mesa post damage will not occur during long-term conduction by the devices during the CVD steps of forming the passivation layer 145 or the upper DBR minor 150. Accordingly, it was found that the laser devices of the first and second embodiments have extremely high reliability. Furthermore, the same effect was achieved in other structures in which an oxidized current confinement layer that accompanies the graded-composition layer of the present application is formed within 200 nm of the active layer. At this time, no change in the device characteristics due to formation of the oxidized current confinement layer was observed.

In the first and second embodiments, the current injection portion 110a is made of $Al_{0.97}Ga_{0.03}As$, but can be made of AlAs instead. In this case, the current confinement portion 110b is an Al oxide resulting from oxidation of the AlAs.

Figure 15:
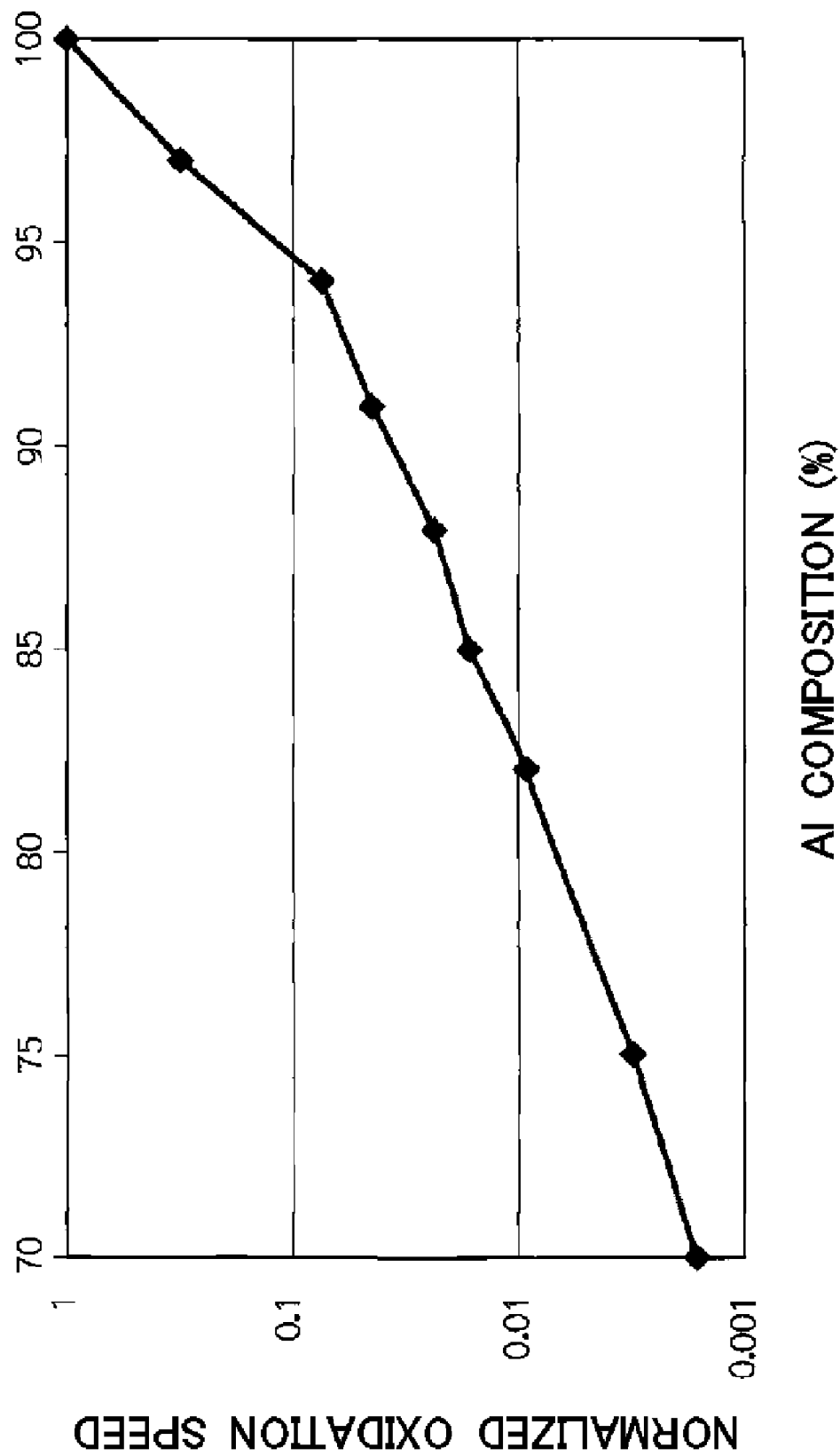
FIG. 15 shows a relationship between Al composition in AlGaAs and oxidation rate of AlGaAs.

FIG. 15 shows a relationship between the Al composition ratio x (%) and the oxidation speed of $Al_xGa_{1-x}As$ when the AlAs oxidation speed is set as 1. From FIG. 15, it can be seen that the curve of this relationship has a point of inflection at an Al composition ratio x (%) of 93%. Accordingly, the current injection portion 110a is preferably formed of AlAs or $Al_xGa_{1-x}As$ ($0.93 \leq x < 1$), and the current confinement portion 110b is preferably formed of an oxide compound whose primary component if Al oxide resulting from the oxidation of AlAs or $Al_xGa_{1-x}As$ ($0.93 \leq x < 1$).

Figure 16:
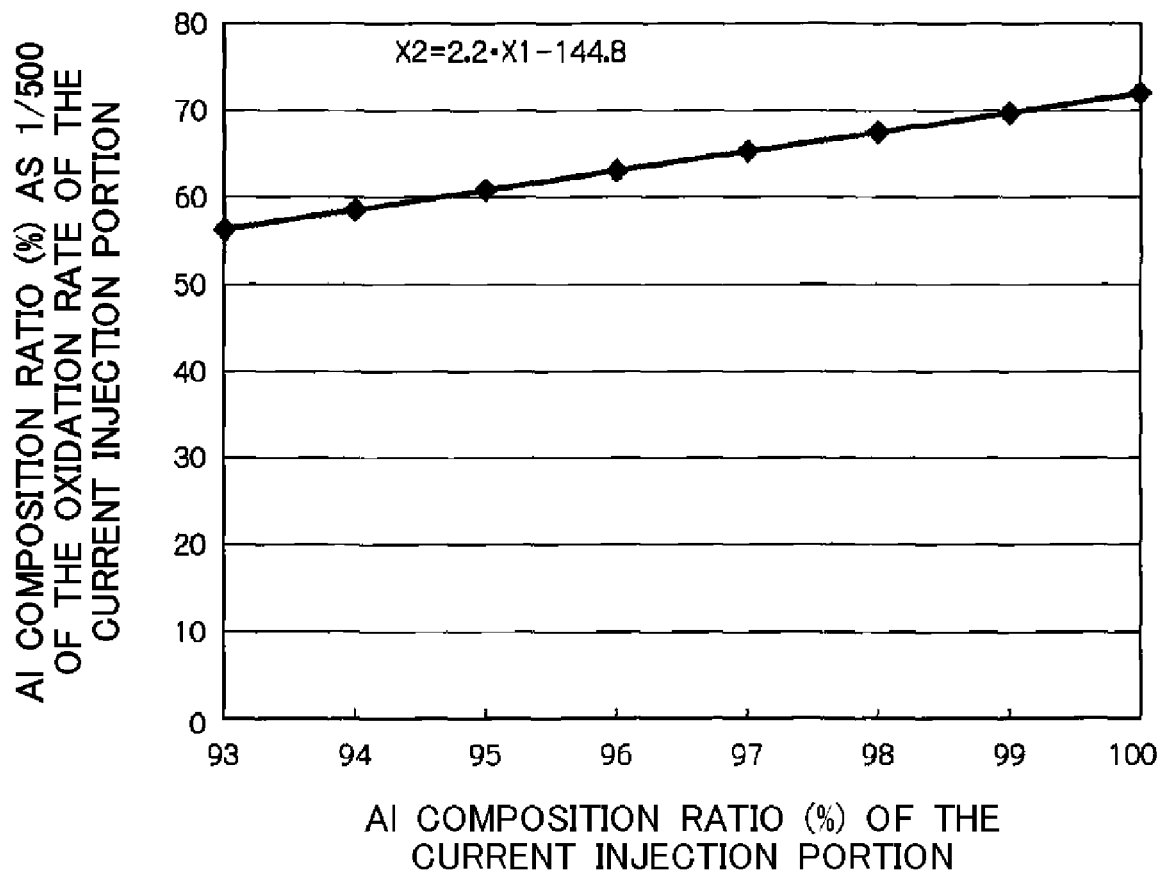
FIG. 16 shows a relationship between Al composition ratio (%) of a current injection portion and Al composition ratio (%) obtained for an oxidation rate that is 1/500 of an oxidation rate of the current injection portion.

In FIG. 15, with the standardized oxidation rate of change represented by Y and the Al composition ratio represented by X (%), for an approximated line A when the Al composition ratio X (%) is 93% or more, $Y = 6.750 \times 10^{-84} X^{41.59}$. Furthermore, for an approximated line B when the Al composition ratio X (%) is 93% or less, $Y = 1.793 \times 10^{-26} X^{12.42}$. The oxidation rate of the current injection portion 110a formed by the $Al_xGa_{1-x}As$ ($0.93 \leq x < 1$) can be calculated from the approximated line A, and the Al composition ratio X2(%) when the approximated line B can be calculated as 1/500 of this oxidation rate. Here, the relationship between X2 and the Al composition ratio X1(%) of the current injection portion 110a formed of $Al_xGa_{1-x}As$ ($0.93 \leq x < 1$) is such that $X2 = 2.2 \cdot X1 - 144.8$, as shown in FIG. 16.

Accordingly, if the $Al_{0.6}Ga_{0.4}As$ layer 173 of the first and second embodiments is replaced with an $Al_{X2}Ga_{1-X2}As$ layer having an Al composition ratio no larger than the Al composition ratio X2(%), where $X2 = 2.2 \cdot X1 - 144.8$, with respect to the Al composition ratio X1(%) of the current injection portion 110a formed of AlAs or $Al_xGa_{1-x}As$ ($0.93 \leq x < 1$), the oxidation can be reliably stopped by the $Al_{X2}Ga_{1-X2}As$ layer. In the first and second embodiments, the Al composition ratio X1 of the current injection portion 110a is 97%. Therefore, when this value is substituted for X1 in the equation $X2 = 2.2 \cdot X1 - 144.8$, $X2 = 2.2 \cdot 97 - 144.8 = 68.6(\%)$. Since the first and second embodiments use the $Al_{0.6}Ga_{0.4}As$ layer 173 in which X2=60%, this layer 173 can reliably stop the oxidation.

The Al composition ratio of the layer used to stop the oxidation is preferably no less than 0.40 and no larger than 0.65. This is because the oxidation stops before reaching the stop layer if the Al composition ratio is less than 0.40, and the oxidation speed only drops by 1% or less compared to the oxidation speed of the As compound used in the current confinement layer with an Al composition of 0.85 or more if the Al composition ratio is larger than 0.65. The layer used to stop the oxidation preferably has a thickness no less than 1.5 nm and no larger than 4.5 nm. If the layer for stopping the oxidation has this thickness and an Al composition ratio within the range described above, the oxidation can be reliably stopped and an increase in resistance is suppressed.

In the above embodiments, the composition for both of the AlGaAs layers 171b and 172b is $Al_{0.97}Ga_{0.03}As$, which is the same as the current injection portion 110a of the current confinement layer 110. But instead, the AlGaAs layers 171b and 172b may be made of AlGaAs with lower Al content than the current injection portion 110a.

In the above embodiments, the pseudo AlGaAs layers 171 172, 174, and 175 are formed by the AlGaAs layers 171b, 172b, 174b, and 175b and the GaAs layers 171a, 172a, 174a, and 175a. But instead, each of the pseudo AlGaAs layers 171 172, 174, and 175 may be formed of a first AlGaAs layer and a second AlGaAs layer with lower Al content than the first AlGaAs layer, with each second AlGaAs layer formed closer to the current confinement layer than the corresponding first AlGaAs layer.

The variation t1 of the border between the oxide region 111b and the non-oxidized semiconductor region 111c and the variation t1 of the border between the oxide region 109b and the non-oxidized semiconductor region 109c, in other words, the unevenness t1 of the border between the oxide region 111b and the non-oxidized semiconductor region 111c and the unevenness t1 of the border between the oxide region 109b and the non-oxidized semiconductor region 109c, are preferably no larger than 2 nm.

The thickness of the current injection portion 110a is preferably no larger than ¼ of the oscillation wavelength of the surface emitting laser device 100, and is more preferably no less than 10 nm and no larger than 40 nm. Setting the thickness in this range ensures the current confinement effect and minimizes the dispersion effect. It should be noted that, as described above, the graded-composition layer can be designed to function as a portion of the oxidized current confinement section.

The semiconductor laser devices of the above embodiments are surface emitting laser devices, but the structures and manufacturing methods of the semiconductor laser devices of the above embodiments can be applied to a facet emitting semiconductor laser instead. In this case, the current confinement layer 110 is formed by a center current injection portion 110a and a current confinement portion 110b on both sides thereof.

In the embodiments, the unevenness was measured by a scanning electron microscope (SEM). For the oxidized current confinement layer formed in the mesa post, unevenness increased in the layer direction in the periphery of the mesa post, i.e. in the oxidized portion of the base, and in the center of the mesa post, i.e. the tip of the mesa post within the surface of the oxidized portion. Therefore, in the embodiments, measurement was performed in a region in which the unevenness is relatively uniform near the center of the oxidized portion in the oxidation direction, in order to avoid the greater unevenness at the base and tip.

In the embodiments, in order to minimize diffraction of the oscillated light, the oxidized current confinement layer is positioned at a node of the standing wave of light in the cavity (when considering current expansion, the first or second node from the active layer is desirable). But instead, in order to decrease the threshold value, the oxidized current confinement layer may be positioned in contact with the active layer. Furthermore, the current confinement effect can be increased by forming a current confinement layer above and below the active layer.

The above embodiments describe examples in which the oxidized current confinement layer is provided in the cavity. But instead, the a surface emitting laser may be formed in which the oxidized current confinement layer is included in a semiconductor DBR minor made of pairs of AlGaAs/GaAs, thereby suppressing peeling of the minor.

The above embodiments describe examples in which an oxidized current confinement layer of Al is formed on a GaAs substrate and the graded-composition layer is formed around the oxidized current confinement layer. But instead, other group-III-V compounds may be used for the substrate and other layers. For example, an active layer with an InGaAs-strained quantum well structure may be formed on a substrate of InGaAs, an oxidized current confinement layer of InAlAs may be formed on the active layer, and graded-composition layers may be formed on both sides of the oxidized current confinement layer.

The above embodiments describe examples of surface emitting laser devices with oscillation wavelengths in the 1.1 µm band, in which the active layer is formed of InGaAs-based material, but the oscillation wavelength bands of the surface emitting laser devices and the material used to form the active layers may be selected as appropriate. For example, if the oscillation wavelength of the surface emitting laser device is 850 nm, AlGaAs-based material can be selected, and if the oscillation wavelength of the surface emitting laser device is in a band from 1.3 µm to 1.6 µm, AlGaInAs-based material, GaInNAs-based material, or GaInNAsSb material can be selected.

Figure 17:
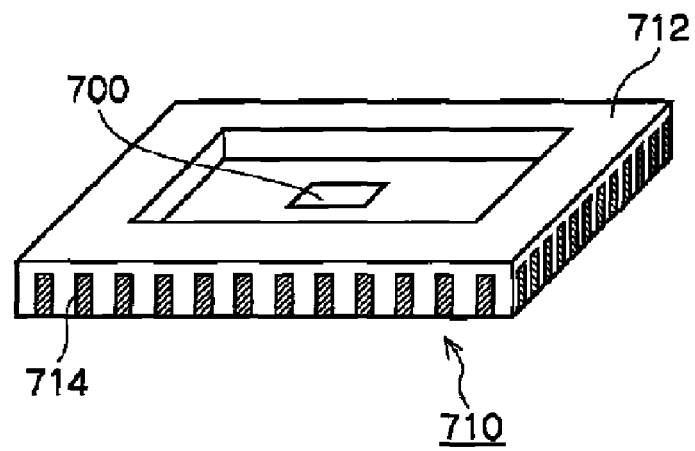
FIG. 17 is a schematic perspective view of a surface emitting laser array using a plurality of surface emitting laser devices, according to a third embodiment of the present invention.
Figure 18:
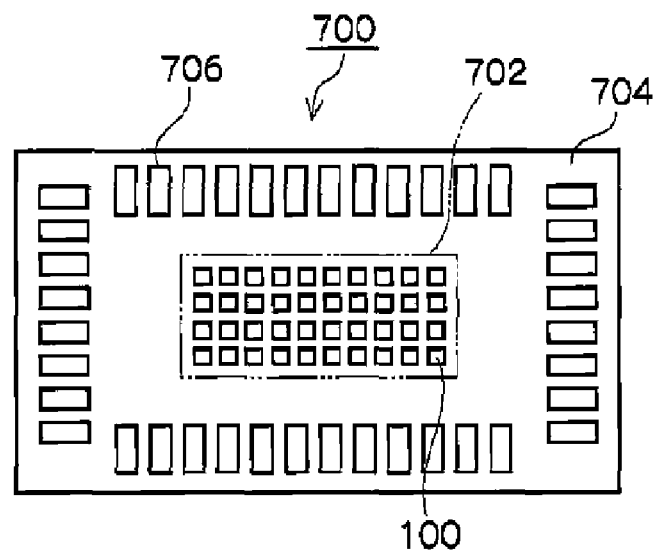
FIG. 18 is a schematic planar view of a surface emitting laser array chip using a plurality of surface emitting laser devices according to the present invention.

The following describes an exemplary surface emitting laser array using a plurality of the surface emitting laser devices 100 of the above embodiments, with reference to FIGS. 17 and 18. For example, FIG. 17 shows a known flat package 710, referred to as a ceramic leaded chip carrier (CLCC), on which a surface emitting laser array chip 700 is mounted. To simplify the diagram, connections between metal casters (electrodes) 714 and the surface emitting laser array chip 700 are not shown. As shown in FIG. 18, the surface emitting laser array chip 700 includes a device region 702 made of a plurality of surface emitting laser devices 100 formed in a center region, and a plurality of electrode pads 706 provided in a peripheral region and connected (not shown) to a plurality of light emitting units of the device region 702. Each electrode pad 706 is connected (not shown) to the metal caster 714 of a flat package 712. Each light emitting unit is controlled by an external control circuit (not shown) connected to the flat package 712, to emit laser light of a predetermined wavelength.

Figure 19:
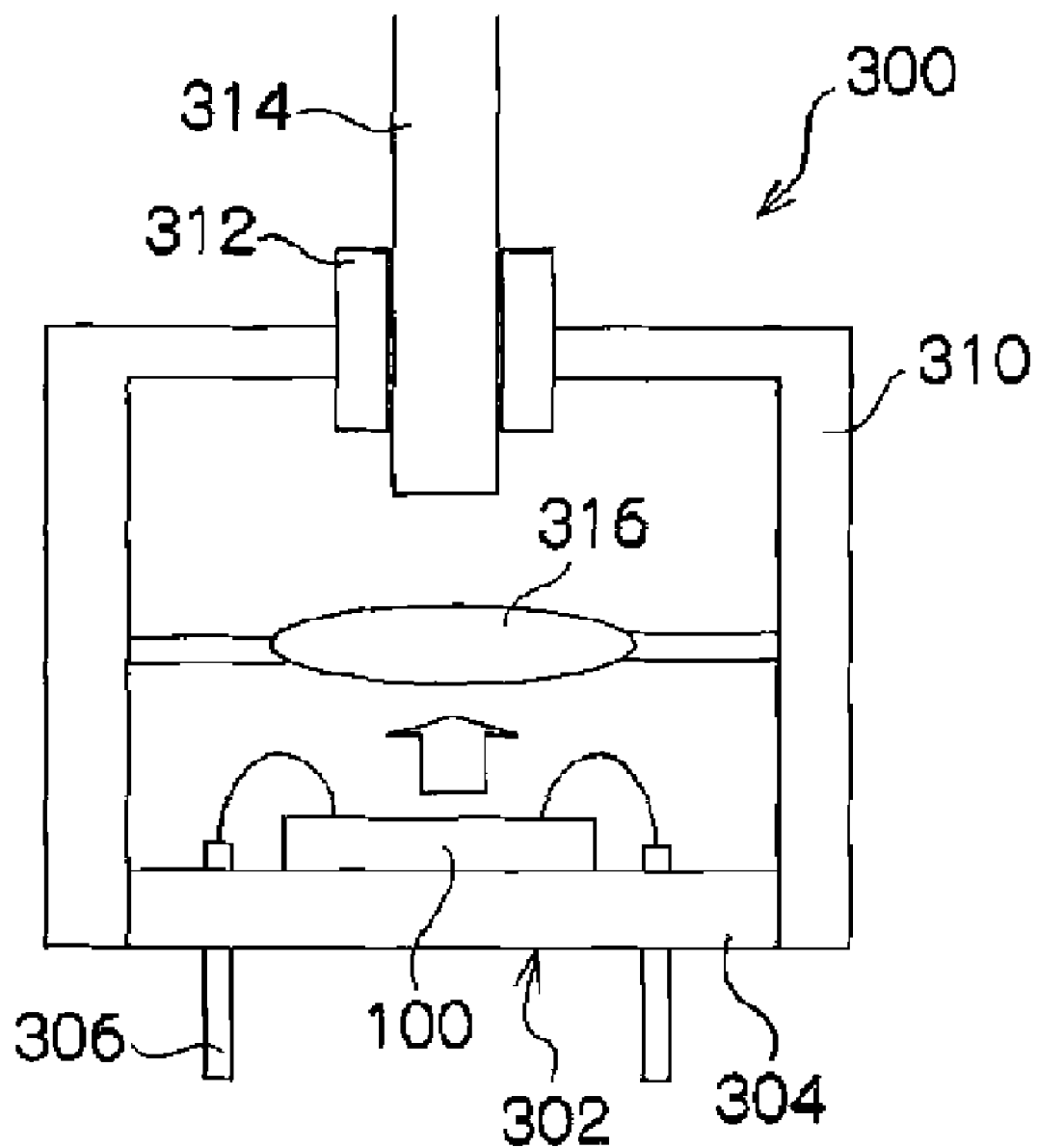
FIG. 19 is a schematic vertical cross-sectional view of a surface emitting laser package using the surface emitting laser device according to the present invention.

The following describes an example in which surface emitting laser devices 100 of the above embodiments are applied to optical equipment, with reference to the drawings. FIG. 19 is a schematic vertical cross-sectional view of a structure resulting from a surface emitting laser device 100 of the above embodiments being applied to a package of a light emitting device. The surface emitting laser package 300 includes the surface emitting laser device 100, a surface emitting laser module made of a substrate 304 and electrodes 306, a lens 316, a housing 310, an optical fiber mount 312, and an optical fiber 314. The electrodes 306 are electrically connected to an external control circuit (not shown), and control the light emission of the surface emitting laser package. The laser light emitted from the surface emitting laser device 100 is focused by the lens 316 and coupled by the optical fiber 314.

Figure 20:
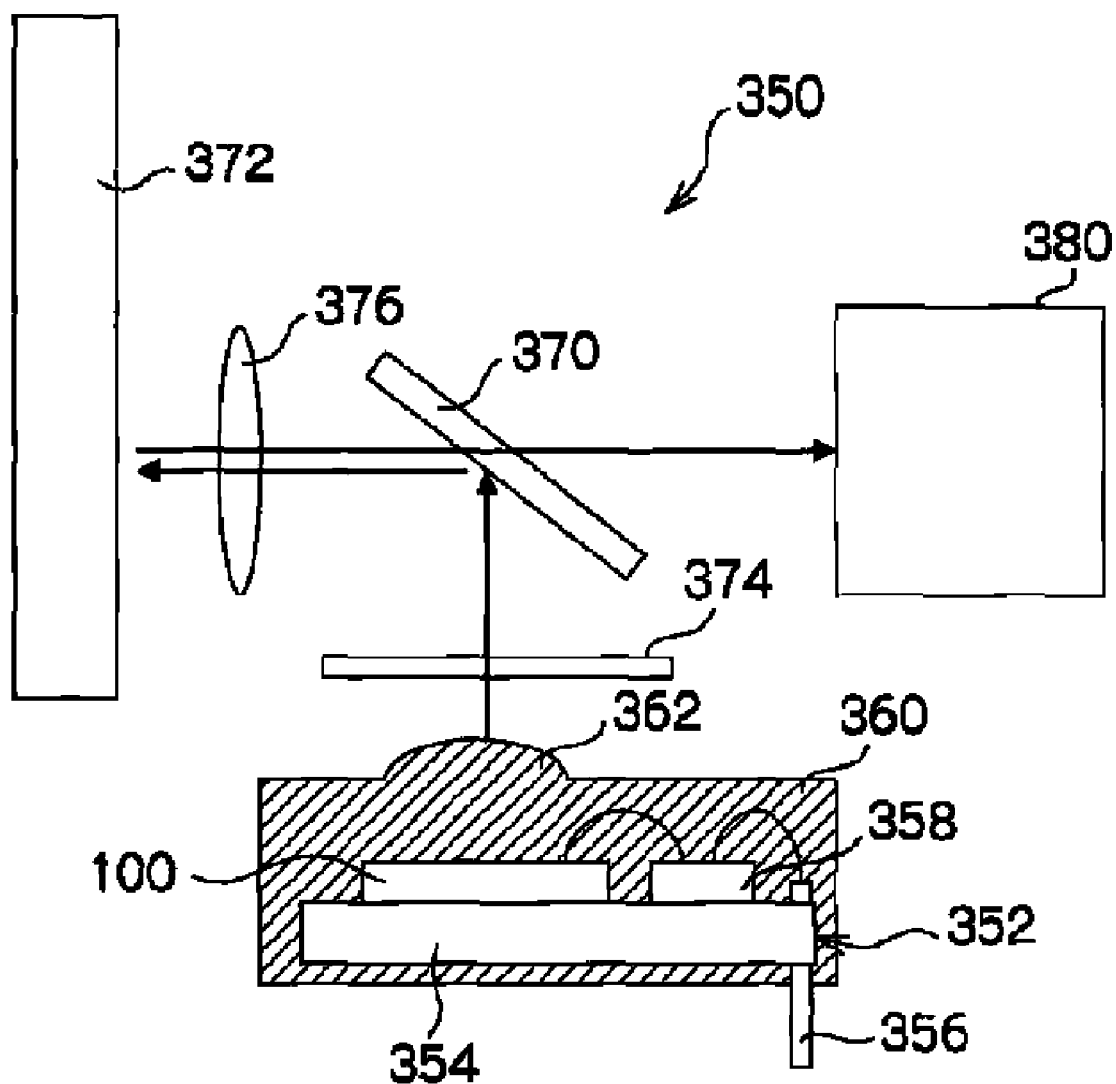
FIG. 20 is a schematic vertical cross-sectional view of an optical pickup using the surface emitting laser device according to the present invention.

FIG. 20 is a schematic vertical cross-sectional view of a structure resulting from a surface emitting laser device 100 of the above embodiments being applied to a pickup of an apparatus that reads from and/or writes to an optical storage medium. An optical pickup 350 includes a surface emitting laser module made of the surface emitting laser device 100, a substrate 354, electrodes 356, a drive IC 358, and a resin 360 sealing these components. The optical pickup 350 further includes a lens 376, a half mirror 370, a diffraction grating 374, an optical sensor 380, and an optical storage medium 372. The emitting surface of the resin 360 is machined to be convex, thereby forming a lens 362. The electrodes 356 are electrically connected to an external control circuit (not shown), and control the light emission of the laser pickup. The laser light emitted from the surface emitting laser device 100 is collimated by the lens 362 and reflected by the half mirror 370, after which the light is focused by the lens 376 at a predetermined location of the optical storage medium 372. The light reflected by the optical storage medium 372 is incident to the optical sensor 380.

The above describes examples in which a surface emitting laser device 100 or a surface emitting laser array including a plurality of surface emitting laser devices 100 according to the above embodiments is applied to a light emitting device package used for communication or a pickup used for an optical disk, but the present invention is not limited to these application. For example, the present invention can be used in optical equipment such as a measurement device, a laser pointer, an optical mouse, a light source for a printer, a light source for photoresist scanning exposure, a light source for laser pointing, or a light source of a fiber laser used for machining.

Figure 21:
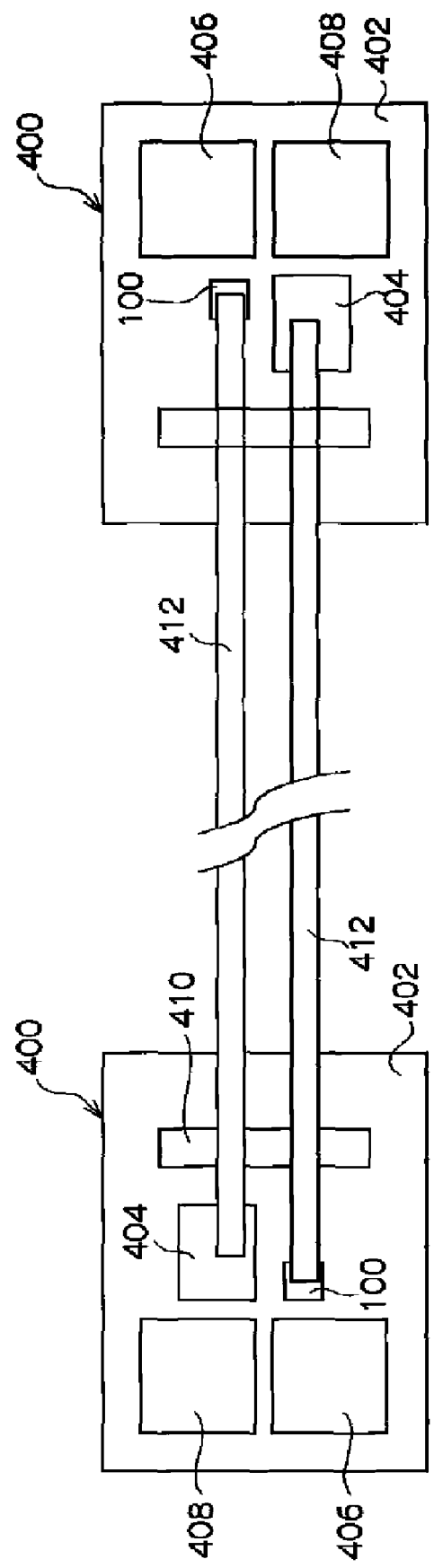
FIG. 21 is a schematic planar view of an optical transceiver module using the surface emitting laser device according to the present invention.

FIG. 21 shows a schematic configuration of optical transceiver modules using surface emitting laser devices 100 of the above embodiments. As shown in FIG. 21, each optical transceiver module 400 includes a holding member 402, an optical waveguide (optical fiber) 412, a spacer 410 for positioning the optical waveguide 412 on the holding member 402, the surface emitting laser device 100 or a surface emitting semiconductor laser array including a plurality of surface emitting laser devices 100 for transmitting optical signals through the optical waveguide 412, a photodetector 404 for detecting the optical signals, a driving circuit 406 for controlling the light emission of the surface emitting laser device 100 or the surface emitting semiconductor laser array, and an amplifying circuit 408 for amplifying the signals detected by the photodetector 404.

The light emission of the surface emitting laser device 100 or the surface emitting semiconductor laser array is controlled via the driving circuit 406 by a control signal from an external unit (not shown), and the signals detected by the photodetector 404 are transmitted to a control unit via the amplifying circuit 408. To simplify the drawing, the wire bondings between the driving circuit 406 and the surface emitting laser device 100 or the surface emitting semiconductor laser array and between the amplifying circuit 408 and the photodetector 404 are not shown.

Figure 22:
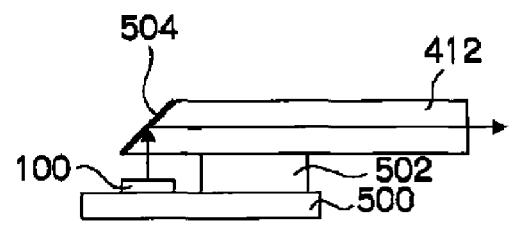
FIG. 22 is a schematic vertical cross-sectional view of an example of an optical coupling structure including an optical waveguide and the surface emitting laser device or the surface emitting laser array according to the embodiment.
Figure 23:
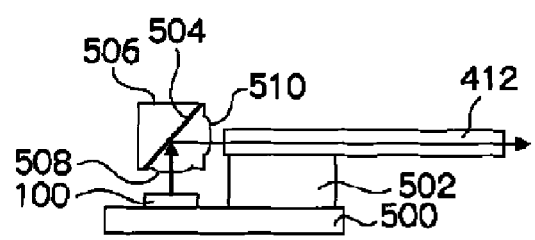
FIG. 23 is a schematic vertical cross-sectional view of another example of the optical coupling structure including the optical waveguide and the surface emitting laser device or the surface emitting laser array according to the embodiment.
Figure 24:
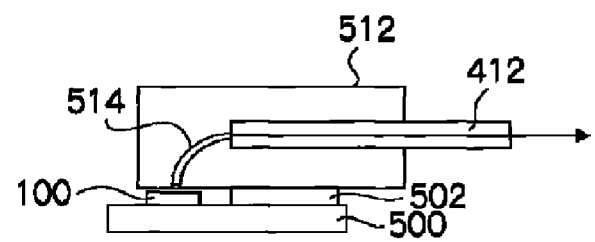
FIG. 24 is a schematic vertical cross-sectional view of still another example of the optical coupling structure including the optical waveguide and the surface emitting laser device or the surface emitting laser array according to the embodiment.

FIGS. 22 to 24 are schematic views of optical coupling between the optical waveguide 412 and the surface emitting laser device 100 or the surface emitting semiconductor laser array shown in FIG. 21. The substrate 500, the surface emitting laser device 100 or the surface emitting semiconductor laser array, and the optical waveguide 412 are all the same in FIGS. 22 to 24. In FIG. 22, the facet of the optical waveguide 412 is inclined at approximately 45 degrees with respect to the optical axis. The inclined surface thereof is made reflective by coating with a reflective film, for example, to form an inclined reflective surface 504. The light output from the surface emitting laser device 100 or the surface emitting semiconductor laser array is input to the lower surface of the optical waveguide 412 and reflected by the inclined reflective surface 504 to be propagated within the optical waveguide 412.

In FIG. 23, a mirror assembly 506 with the inclined reflective surface 504 formed at the optical waveguide 412 facet side therein is disposed on the surface emitting laser device 100 or the surface emitting semiconductor laser array. The light emitted by the surface emitting laser device 100 or the surface emitting semiconductor laser array is input to the bottom surface of the mirror assembly 506, and is reflected by the inclined reflective surface 504. The light output from the mirror assembly 506 is coupled by the optical waveguide 412 and propagated within the optical waveguide 412. A microlens (array) may be disposed on the incident surface and/or the emitting surface of the mirror assembly 506. In FIG. 24, the optical waveguide 412 is arranged in a connector housing 512, and a facet of a curved portion 514 of the optical waveguide core is arranged to face the surface emitting laser device 100 or the surface emitting semiconductor laser array. The light emitted by the surface emitting laser device 100 or the surface emitting semiconductor laser array is coupled by the optical waveguide 412.

Figure 25:
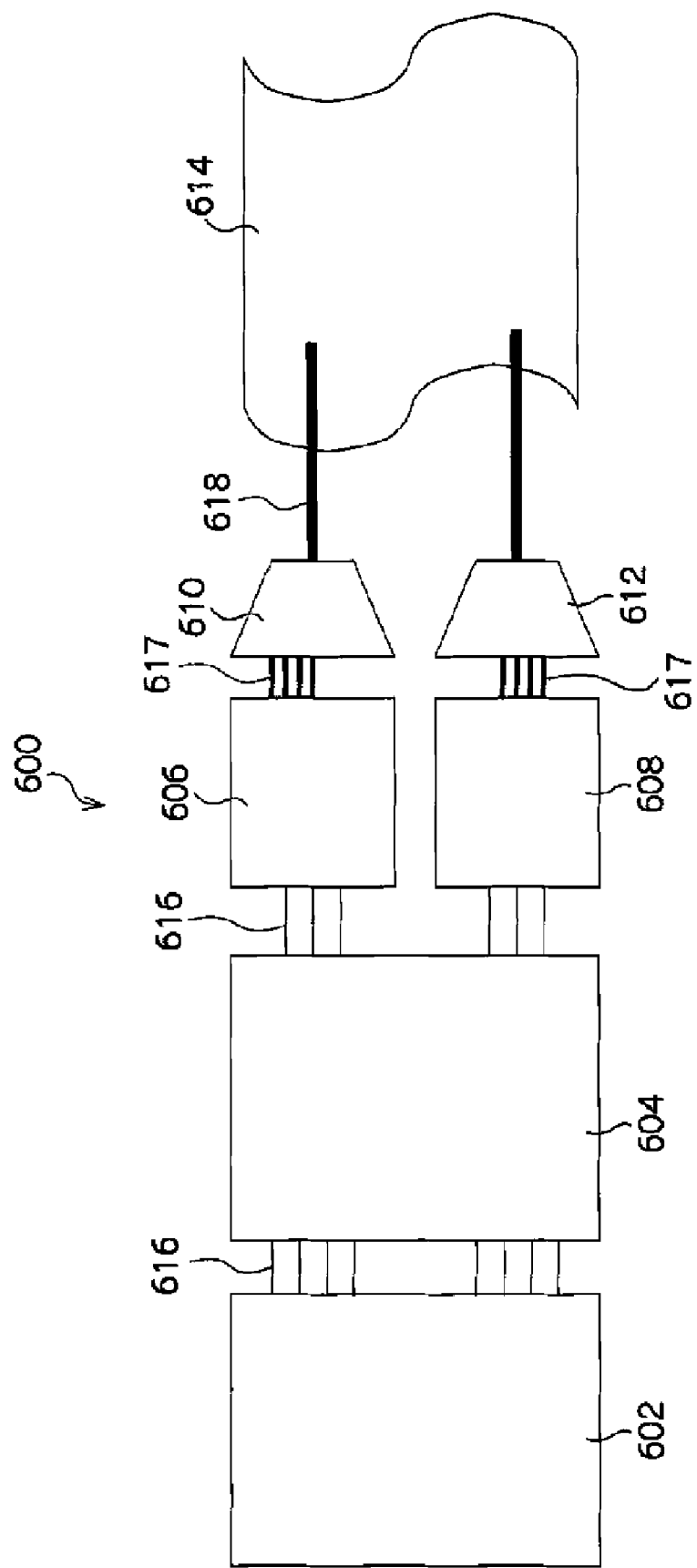
FIG. 25 is a schematic diagram of a communication system including the surface emitting laser device or the surface emitting laser array according to the embodiment.

The following describes an example in which a surface emitting laser device 100 or a surface emitting laser array including a plurality of surface emitting laser devices 100 according to the above embodiments is applied to a communication system. FIG. 25 shows an exemplary configuration of a wavelength-division-multiplexed (WDM) transmission system using the surface emitting laser device 100 or the surface emitting semiconductor laser array. The WDM transmission system shown in FIG. 25 includes a computer, board, or chip 602. The WDM transmission system further includes a communication control circuit (CPU, MPU, optical-electric conversion circuit, electric-optical conversion circuit, or wavelength control circuit) 604, a surface emitting laser array 606 including a plurality of the surface emitting laser devices 100, an integrated photodetector section 608, an optical coupler 610, a branching filter 612, electrical wirings 616, optical fibers 617 and 618, and a network, PC, board, or chip 614 that is the communication target.

In the WDM transmission system shown in FIG. 25, the surface emitting laser array 606 is formed by arranging a plurality of surface emitting laser devices with different oscillation wavelengths. Each oscillated light from a surface emitting laser device of the surface emitting laser array 606 passes through an optical coupler to be coupled in a single optical fiber. With this configuration, signal communication with high throughput and high capacity can be achieved with a single optical fiber. In this way, the surface emitting laser array of the present embodiment has a stable mode and stable oscillation wavelengths, thereby enabling wavelength-multiplexed transmission with high density, high capacity, and high reliability. In this embodiment, the input optical fiber or the output optical fiber of each surface emitting laser array 606 or integrated photodetector section 608 are combined into a single optical fiber using the optical coupler 610 or the branching filter 612. But instead, depending on the usage, the output optical fibers or the input optical fibers can be connected as-is to the network, PC, board, or chip 614 serving as the communication target, thereby forming a parallel communication system. In this case, the surface emitting laser array of the present embodiment has a stable mode and stable wavelengths, and can therefore be used to easily construct a highly-reliable parallel communication system with a plurality of light sources.

While the embodiments of the present invention have been described, the technical scope of the invention is not limited to the above described embodiments. The scope of the present invention is limited only by the claims.

What is claimed is:

1. A surface emitting laser, comprising:
a group-III-V compound substrate;
a cavity region formed on the group-III-V compound substrate, the cavity including an active layer, and
a current confinement layer that has an aluminum oxide compound and is configured to confine a current path, through which a current is to be injected into the active layer, to a current injection portion of the current confinement layer;
an upper distributed Bragg reflector (DBR) minor and a lower DBR minor formed on the substrate, and sandwiching the cavity region; and
a pseudo graded composition layer including first and second pseudo graded composition layers one of which is formed directly above the current confinement layer and the other is formed directly beneath the current confinement layer, the pseudo graded composition layer having an aluminum composition ratio decreasing monotonically as a distance from the current confinement layer increases;
wherein
the first pseudo graded composition layer includes
an oxidation stop layer,
a first, oxidized region which has a change rate of the aluminum composition ratio lower than that of the oxidation stop layer, and in which the first pseudo graded composition layer is oxidized from an interface with the current confinement layer to at least a portion of the oxidation stop layer, and
a second, non-oxidized region which is outside the first region, and
the current injection portion of the current confinement layer is in direct contact with the second region of the first pseudo graded composition layer.

2. The surface emitting laser according to claim 1, wherein the aluminum composition ratio of the oxidation stop layer changes from 0.8 to 0.4 as a distance from an interface with the first region increases.

3. The surface emitting laser according to claim 1, wherein the first pseudo graded composition layer further includes
a third region that contacts the oxidation stop layer,
the oxidation stop layer is sandwiched between the first and third regions,
the first region includes an $Al_xGa_{1-x}As$ layer and a GaAs layer, where $0.85 \leq x \leq 1$,
the oxidation stop layer is made of $Al_yGa_{1-y}As$, where $0.4 \leq y \leq 0.65$, and
the third region includes $Al_zGa_{1-z}As$ and GaAs, where $z \leq y$.

4. The surface emitting laser according to claim 3, wherein $0.93 \leq x \leq 1$ and $z=y$.

5. The surface emitting laser according to claim 1, wherein the first pseudo graded composition layer further includes
a third region that contacts the oxidation stop layer,
the oxidation stop layer is sandwiched between the first and third regions,
the first region has a composition that continuously changes in a range between $Al_xGa_{1-x}As$, where $0.85 \leq x \leq 1$, and $Al_yGa_{1-y}As$, where $0.4 \leq y \leq 0.65$,
the oxidation stop layer is made of $Al_yGa_{1-y}As$, where $0.4 \leq y \leq 0.65$, and
the third region has a composition that continuously changes in a range between $Al_yGa_{1-y}As$, where $0.4 \leq y \leq 0.65$, and $Al_zGa_{1-z}As$, where $0 \leq z \leq 0.1$.

6. The surface emitting laser according to claim 5, wherein $0.93 \leq x \leq 1$.

7. The surface emitting laser according to claim 1, wherein the oxidation stop layer has a thickness no less than 1.5 nanometers and no larger than 4.5 nanometers.

8. The surface emitting laser according to claim 1, wherein an interface between the first and second regions of the first pseudo graded composition layer has unevenness of no larger than 2 nanometers in thickness.

9. The surface emitting laser according to claim 1, wherein thickness of the first region is no larger than ¼ of an oscillation wavelength of the surface emitting laser.

10. A surface emitting laser array comprising a plurality of surface emitting lasers each as defined according to claim 1.

11. An optical device comprising a surface emitting laser according to claim 1.

12. A communication system comprising a surface emitting laser according to claim 1.

13. A surface emitting laser, comprising:
a group-III-V compound substrate;
a cavity region formed on the group-III-V compound substrate, the cavity region including an active layer;
an upper distributed Bragg reflector (DBR) minor and a lower DBR minor formed on the group-III-V compound substrate, and sandwiching the cavity region, wherein at least a portion of either one of the upper DBR minor and the lower DBR minor includes a current confinement layer that has an aluminum oxide compound and is configured to confine a current path, through which a current is to be injected into the active layer, to a current injection portion of the current confinement layer;
a pseudo graded composition layer including first and second pseudo graded composition layers one of which is formed directly above the current confinement layer and the other is formed on directly beneath the current confinement layer, the pseudo graded composition layer having an aluminum composition ratio decreasing monotonically as a distance from the current confinement layer increases;
wherein
the first pseudo graded composition layer includes
an oxidation stop layer,
a first, oxidized region which has a change rate of the aluminum composition ratio lower than that of the oxidation stop layer, and in which the first pseudo graded composition layer is oxidized from an interface with the current confinement layer to at least a portion of the oxidation stop layer, and
a second, non-oxidized region which is outside the first region, and
the current injection portion of the current confinement layer is in direct contact with the second region of the first pseudo graded composition layer.

14. The surface emitting laser according to claim 13, wherein
the second pseudo graded composition layer includes
an oxidation stop layer,
a first, oxidized region which has a change rate of the aluminum composition ratio lower than that of the oxidation stop layer, and in which the second pseudo graded composition layer is oxidized from an interface with the current confinement layer to at least a portion of the oxidation stop layer, and
a second region which is outside the first region, and
the current injection portion of the current confinement layer is in direct contact with and sandwiched between the second regions of the first and second pseudo graded composition layers.

15. The surface emitting laser according to claim 14, wherein the second regions of the first and second pseudo graded composition layers are semiconductor regions.

16. The surface emitting laser according to claim 13, wherein the second region of the first pseudo graded composition layer is a semiconductor region.

17. The surface emitting laser according to claim 1, wherein
the second pseudo graded composition layer includes
an oxidation stop layer,
a first, oxidized region which has a change rate of the aluminum composition ratio lower than that of the oxidation stop layer, and in which the second pseudo graded composition layer is oxidized from an interface with the current confinement layer to at least a portion of the oxidation stop layer, and
a second region which is outside the first region, and
the current injection portion of the current confinement layer is in direct contact with and sandwiched between the second regions of the first and second pseudo graded composition layers.

18. The surface emitting laser according to claim 17, wherein the second regions of the first and second pseudo graded composition layers are semiconductor regions.

19. The surface emitting laser according to claim 1, wherein the second region of the first pseudo graded composition layer is a semiconductor region.

* * * * *